United States Patent
Amarilio et al.

(10) Patent No.: US 6,924,662 B2
(45) Date of Patent: Aug. 2, 2005

(54) CONFIGURABLE CELL FOR CUSTOMIZABLE LOGIC ARRAY DEVICE

(75) Inventors: Lior Amarilio, Kiryat Ala (IL); Ariela Benasus, Haifa (IL); Michael Barshay, Nesher (IL); Tomer Refael Ben-Chen, Binyamina (IL)

(73) Assignee: Chip Express (Israel) Ltd., Haifa (IL)

( * ) Notice: Subject to any disclaimer, the term of this patent is extended or adjusted under 35 U.S.C. 154(b) by 0 days.

(21) Appl. No.: 10/311,135

(22) PCT Filed: Jun. 14, 2001

(86) PCT No.: PCT/IL01/00548

§ 371 (c)(1),
(2), (4) Date: Jul. 24, 2003

(87) PCT Pub. No.: WO01/97382

PCT Pub. Date: Dec. 20, 2001

(65) Prior Publication Data

US 2004/0027156 A1 Feb. 12, 2004

(51) Int. Cl.$^7$ .......................................... H03K 19/177
(52) U.S. Cl. .......................................... 326/38; 326/40
(58) Field of Search ............................. 326/37–41, 46, 326/47, 101, 102

(56) References Cited

U.S. PATENT DOCUMENTS

| | | | |
|---|---|---|---|
| 4,825,105 A | 4/1989 | Holzle | 307/440 |
| 5,289,021 A | 2/1994 | El Gamal | 257/206 |
| 5,428,304 A | 6/1995 | Landers et al. | 326/41 |
| 5,684,412 A | 11/1997 | Yoeli et al. | 326/39 |
| 5,698,992 A * | 12/1997 | El Ayat et al. | 326/41 |
| 5,751,162 A | 5/1998 | Mehendale et al. | 326/37 |
| 5,751,165 A | 5/1998 | Yoeli et al. | 326/47 |
| 5,780,883 A | 7/1998 | Tran et al. | 257/206 |
| 5,861,641 A | 1/1999 | Yoeli et al. | 257/211 |
| 5,894,565 A | 4/1999 | Furtek et al. | 395/500 |
| 5,999,015 A | 12/1999 | Cliff et al. | 326/39 |
| 6,166,560 A | 12/2000 | Ogura et al. | 326/41 |
| 6,177,709 B1 | 1/2001 | Iranmanesh | 257/390 |
| 6,294,927 B1 | 9/2001 | Yoeli et al. | 326/40 |

* cited by examiner

*Primary Examiner*—Don Le
(74) *Attorney, Agent, or Firm*—Wiggin And Dana LLP; Gregory S. Rosenblatt; Timothy J. Olson

(57) ABSTRACT

This invention discloses a cell forming part of a customizable logic array device, the cell including at least first (34) and second multiplexers, each having a select input and an output, at least two inverters (42, 52), each having an input and an output, and electrical connections (26, 54), selectably connecting the output of the first multiplexer to either the select input of the second multiplexer or to the at least two inverters. A customizable logic array device including a plurality of cells, each cell including at least first and second multiplexers is also disclosed. The invention additionally discloses a cell forming part of a customizable logic array device, the cell including a pair of identical logic portion located on opposite sides of a driver portion. The driver portion includes at least two drivers, each having an input and an output. The pair of identical logic portions including at least one multiplexer (12) having a select input and an output, at least one inverter (18) having an input and an output and at least one NAND gate (30) having two inputs and an output. Preferably the cell also includes electrical connections, selectably connecting each output of each element of the cell to any other input or output of any other element of the same cell, preferably at the same metal layer.

6 Claims, 26 Drawing Sheets

CONFIGURABLE CELL FOR CUSTOMIZABLE LOGIC ARRAY DEVICE

This application is the national phase under 35 U.S.C. 371 of PCT international Application No. PCT/IL01/00548 which has an international Filing date of Jun. 14, 2001.

FIELD OF THE INVENTION

The present invention relates to application-specific integrated circuits generally and more particularly to the structure of the principal building blocks of gate arrays in multi-metal semiconductor devices.

Application specific integrated circuits (ASICs) are microelectronic devices that are designed and configured to carry out sets of instructions for specific applications. Application specific integrated circuits are preferable over general-purpose of-the-shelf devices when speed, performance or device compactness is desired, or when the specific functionality cannot be obtained by available devices. Generally, the logic portion of an ASIC device is implemented by either standard cell or gate array technology. In the gate array technology an array of cells comprising simply interconnected transistors is provided by tiling and repeating the same cell over and over again. Sometimes a gate array block may be found within a standard cell device or a full custom device. In gate array technology, the metal interconnections are customized for each application. The customization of the metal interconnection layers determines the functionality of the cells and enables the desired application.

For purpose of simplicity, cost savings and short delivery time it is desirable to minimize the number of metal interconnect layers that need to be modified to implement a given functionality. For that purpose, the repetitive cells that build the array must be designed and constructed so they can provide simple as well as complex functionality with minimal overall modifications of the device.

U.S. Pat. Nos. 5,684,412, 5,751,165 and 5,861,641 describe logic cells comprising a cascade of multiplexers that are useful for a gate array that can be programmed by modifying only one or two layers of a multi-layer interconnect structure of the device. The function of each of these cells is input selectable. However, those logic cell structures have the drawback that when it is desirous to implement two simple functions such as two inverters in parallel, two separate unit logic cells have to be employed. This reduces the area utilization of the device, reduces its performance and increases its cost.

The following additional U.S. patents also represent the state of the prior art: U.S. Pat. Nos. 5,751,162; 5,428,304; 5,289,021; 6,177,709; 6,166,560; 4,825,105; 5,780,883.

SUMMARY OF THE INVENTION

The present invention seeks to provide an improved customizable logic array device and cell therefor.

There is thus provided in accordance with a preferred embodiment of the present invention a cell forming part of a customizable logic array device, the cell including at least first and second multiplexers, each having a select input and an output, at least two inverters, each having an input and an output, and electrical connections, selectably connecting the output of the first multiplexer to either the select input of the second multiplexer or to the input of one of the at least two inverters.

Further in accordance with a preferred embodiment of the present invention the at least first and second multiplexers include at least three multiplexers and the at least two inverters include at least three inverters.

Still further in accordance with a preferred embodiment of the present invention the multiplexers are implemented in at least one metal layer and said electrical connections include vias connecting said at least one metal layer to another metal layer other than said at least one metal layer.

Preferably the another metal layer is a top metal layer.

Alternatively, the another metal layer is an intermediate metal layer.

Moreover in accordance with a preferred embodiment of the present invention the another metal layer is a metal layer lying immediately above the at least one metal layer.

Additionally in accordance with a preferred embodiment of the present invention the cell being further characterized in that it has a programmable logic function. Preferably the programmable logic function is programmable by selection of at least one input to the at least first and second multiplexer and by selectable connection of the electrical connections.

Additionally, the selectable connection is effected by metal deposition, patterned and etch. Alternatively, the selectable connection is effected by application of laser energy to the electrical connections for eliminating portions thereof.

Still further in accordance with a preferred embodiment of the invention the selectable connection may be effected by application of electrical energy to the electrical connections.

Additionally in accordance with a preferred embodiment of the present invention the selectable connection is effected by metal deposition and etching.

Further in accordance with a preferred embodiment of the present invention the cell includes at least three inverters each having generally identical driving power.

Still further in accordance with a preferred embodiment of the present invention at least two of the at least three inverters each have generally identical driving power and a third of the at least three inverters has a driving power different from the driving power of the at least two of the at least three inverters.

Furthermore in accordance with a preferred embodiment of the present invention at least two of the at least three inverters each have generally identical driving power and a third of the at least three inverters has a driving power which is at least double the driving power of each of the at least two of the at least three inverters.

Furthermore in accordance with a preferred embodiment of the present invention the cell includes no more than three multiplexers, no more than five inverters and only a single NAND gate.

There is also provided in accordance with yet another preferred embodiment of the present invention a cell forming part of a customizable logic array device, the cell including at least first and second multiplexers, at least two inverters, and electrical connections, selectably connecting the at least first and second multiplexers and the at least two inverters such that the multiplexers operate either in parallel or in series.

Further in accordance with a preferred embodiment of the present invention the multiplexers are implemented in at least one metal layer and the electrical connections include vias connecting the at least one metal layer to another metal layer other than the at least one metal layer.

Preferably the another metal layer is a top metal layer.

Alternatively, the another metal layer is an intermediate metal layer.

Moreover in accordance with a preferred embodiment of the present invention the another metal layer is a metal layer lying immediately above the at least one metal layer.

There is also provided in accordance with another preferred embodiment of the present invention a customizable logic array device including a plurality of cells, each cell including at least first and second multiplexers, each having a select input and an output, at least two inverters, each having an input and an output, and electrical connections, selectably connecting the output of the first multiplexer to either the select input of the second multiplexer or to the input of one of the at least two inverters.

Further in accordance with a preferred embodiment of the present invention the at least first and second multiplexers include at least three multiplexers and the at least two inverters include at least three inverters.

There is further provided in accordance with yet another preferred embodiment of the present invention a customizable logic array device including a plurality of cells, each cell including at least first and second multiplexers, at least two inverters, and electrical connections, selectably connecting the at least first and second multiplexers and the at least two inverters such that the multiplexers operate either in parallel or in series.

There is additionally provided in accordance with a preferred embodiment of the present invention a cell forming part of a customizable logic array device, the cell including a pair of identical logic portions located on opposite sides of a driver portion.

Preferably, the driver portion includes at least two drivers, each having an input and an output. In accordance with a preferred embodiment of the present invention, the pair of identical logic portions each comprises:

at least one multiplexer having a select input and an output;

at least one inverter having an input and an output; and at least one NAND gate having two inputs and an output.

Preferably, the cell also includes electrical connections, selectably connecting an output of the at least one multiplexer to any of an input of the at least one inverter, an input of the at least one NAND gate, an input of at least one of the at least two drivers and an input of another one of the at least one multiplexer.

Additionally or alternatively, the cell also includes electrical connections, selectably connecting an output of the at least one NAND gate to any of an input of the at least one inverter, an input of the at least one multiplexer and an input of at least one of the at least two drivers.

Additionally or alternatively, the cell also includes electrical connections, selectably connecting an output of the at least one inverter to any of an input of the at least one NAND gate, an input of at least one of the at least two drivers and an input of one of the at least one multiplexer.

There is additionally provided in accordance with a preferred embodiment of the present invention a cell forming part of a customizable logic array device, the cell including a pair of identical logic portions located on opposite sides of a driver portion and electrical connections interconnecting the pair of identical logic portions and the driver portion at the same metal layer.

Preferably, the metal layer is a top metal layer of a microelectronic device. In accordance with a preferred embodiment of the present invention, the electrical connections comprise metal bridges located at the top metal layer. Preferably, the metal bridges connect terminals which are connected to metal segments at the bottom of the microelectronic device that form inputs and outputs.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
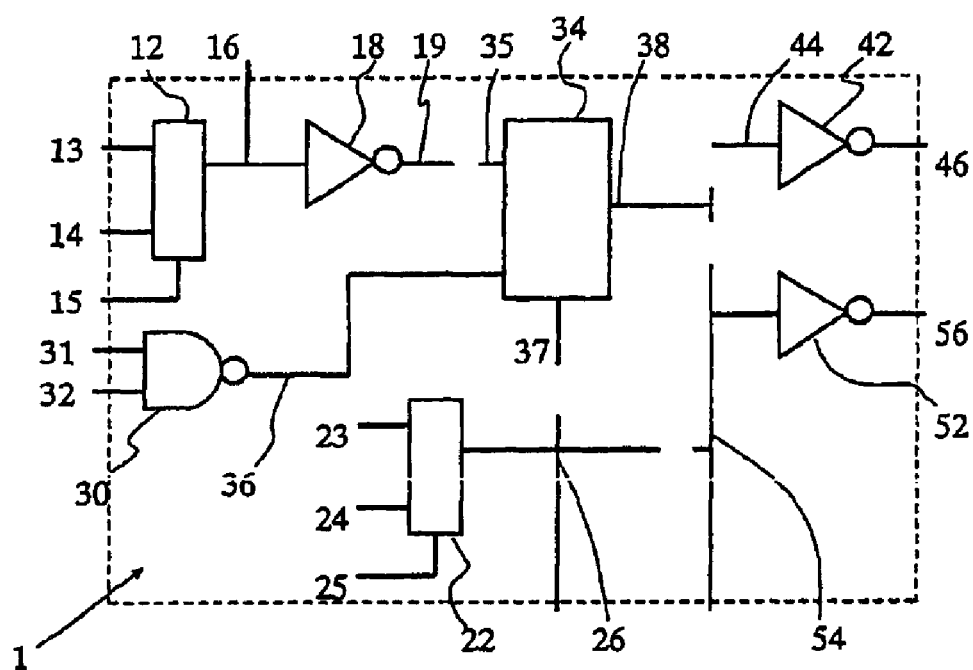
FIG. 1 is a simplified schematic illustration of a base cell constructed and operative in accordance with a preferred embodiment of the present invention.

Reference is now made to FIG. 1, which illustrates a single unit logic cell 1 constructed and operative in accordance with a preferred embodiment of the present invention. The unit logic cell comprises multiple circuit elements, generally similar to those illustrated in U.S. Pat. No. 5,684,412, but with a major distinction that the various elements are not fixedly connected to each other. Rather, the connections between the elements can be reconfigured, as will be described below.

The unit logic cell comprises a first multiplexer 12, having first and second inputs 13 and 14, a select input 15 and an output 16, a second multiplexer 22 having first and second inputs 23 and 24 and a select input 25, a NAND gate 30 having inputs 31 and 32, and a third multiplexer 34 having first and second inputs 35 and 36 and a select input 37. The output 16 of multiplexer 12 is fed to an inverter 18, and the output 36 of the NAND gate 30 is connected to the second input 36 of the multiplexer 34.

The output 19 of inverter 18 can be selectably connected to the first input 35 of the third multiplexer 34. The output 26 of multiplexer 22 can be selectably connected to either the select input 37 of multiplexer 34 or to the input 54 of a second inverter 52. The output 38 of multiplexer 34 can be selectably connected to the input 44 of a third inverter 42, to the input 54 of the second inverter 52, or to both. The inverters 18, 42 and 52 are inverting drivers, also referred below simply as "inverters". Their connection to the respective multiplexers forms inverting multiplexers with drive strengths as outlined below.

Simplicity is a particular feature of the cell of FIG. 1. Preferably the cell of FIG. 1 includes no more than three multiplexers and no more than three inverters. Preferably, only a single NAND gate is provided.

Figure 2A:
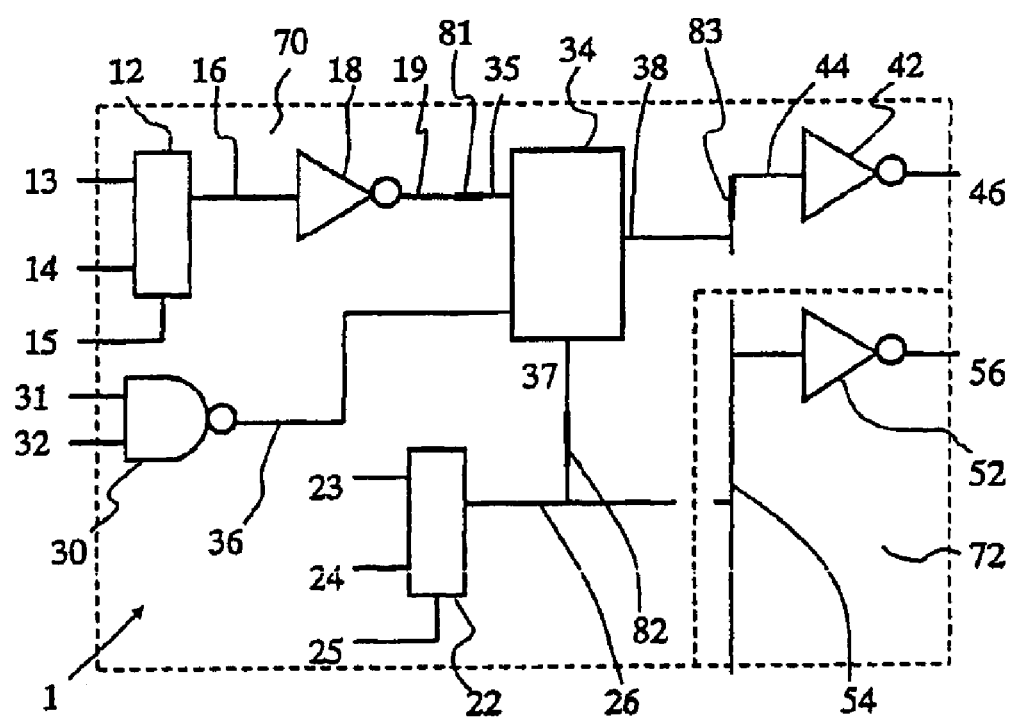
FIG. 2A is a simplified illustration of one configuration of the cell of FIG. 1.

Reference is now made to FIG. 2A, which shows one configuration of the cell of FIG. 1. It is seen that when output 19 of the first inverter 18 is connected to input 35 of the third multiplexer 34, the output 26 of the second multiplexer 22 is connected to select input 37 of the third multiplexer 34, and output 38 of the third multiplexer 34 is connected to input 44 of the third inverter 42, the structure of the resulting cell, shown within dotted lines designated by reference numeral 70, becomes practically the same as that of the cell described in the prior art (U.S. Pat. No. 5,684,412). In this configuration, the inverter 52 shown within dotted lines 72 is not operative in the cell.

Figure 2B:
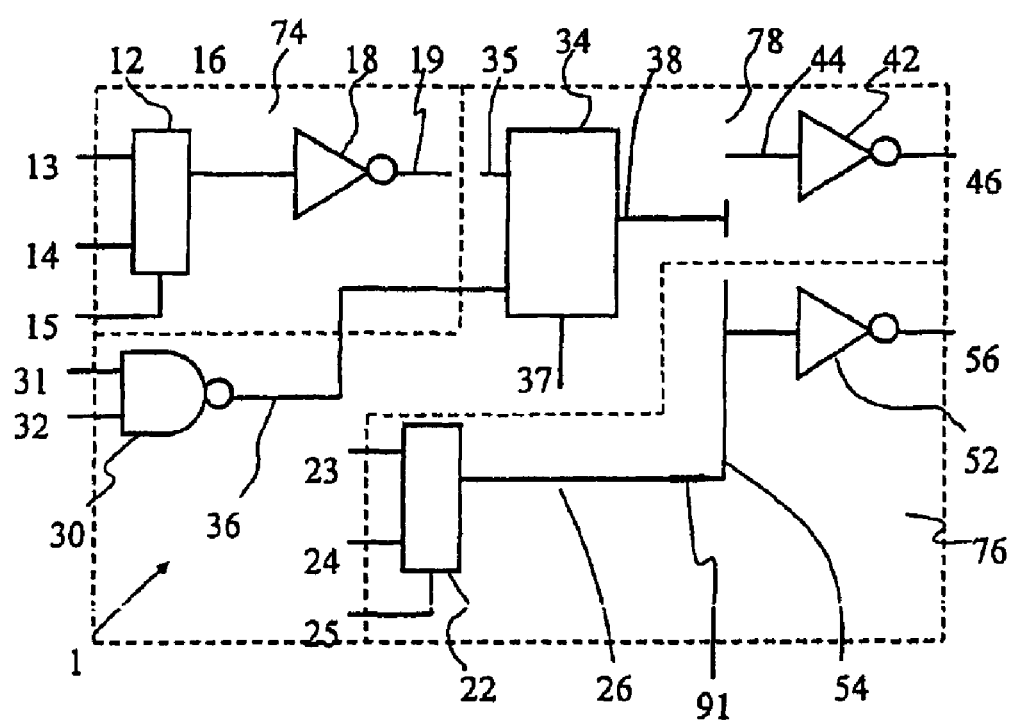
FIG. 2B is a simplified illustration of another configuration of the cell of FIG. 1.

Reference is now made to FIG. 2B, which illustrates an alternative configuration of the cell of FIG. 1. In contrast to the configuration shown in FIG. 2A, in the configuration of FIG. 2B, output 26 of multiplexer 22 is connected to input 54 of inverter 52, and no connection is provided between output 19 of inverter 18 and input 35 of multiplexer 34. The resulting logic cell thus defines two inverting multiplexers which are shown within dotted lines respectively designated by reference numerals 74 and 76. The circuit elements shown within dotted lines designated by reference numeral 78 are not operative in this cell configuration. The two inverting multiplexers can operate in parallel, with inputs 13 and 14 of multiplexer 12 being equivalent to inputs 23 and 24 of multiplexer 22, and select input 15 of multiplexer 12 being equivalent to select input 25 of multiplexer 22 and output 19 of inverter 18 being equivalent to output 56 of inverter 52.

Each of these inverting multiplexers can be further programmed through its inputs to perform a simple, different, input-selectable logic function. For example, when the first input 13 is set to 0 (e.g. connected to Vss), a signal A is connected to input 14 and a signal B is connected to the select input 15, the inverting multiplexer within dotted lines 74 performs the logic function NAND. The same is true for the inverting multiplexer within dotted lines 76. When the first input 13 is connected to a signal A, input 14 is set to 1 (e.g. connected to Vdd) and a signal B is connected to the select input 15, the inverting multiplexer within dotted lines 74 performs the logic function NOR. The same is true for the inverting multiplexer within dotted lines 76.

When the first input 13 is set to 0 (e.g. connected to Vss), the second input 14 is set to 1 (e.g. connected to Vdd) and a signal B is connected to the select input 15 the inverting multiplexer within dotted lines 74 performs as an inverter. The same is true for the inverting multiplexer within dotted lines 76.

The configurability of the interconnects of the various element of the cell of FIG. 1 provides the following useful properties:

a) In the prior art cells, when two simple logic functions need to be implemented in parallel, such as two multiplexers, a NOR and a NAND, an inverter and a NOR, or an inverter and a NAND, in each case the design requires two separate logic cell sites. With the configurable logic cell of FIG. 1, one can break up the logic cell to operate two separate logic functions in parallel within the same logic cell. This property allows higher area utilization of the device, which leads to reduction in cost and increase in device density.

b) The selectable connectivity of output 38 of multiplexer 34 to the inverters 42 and 52 allows connecting one or two inverters in parallel. This is useful for matching the desired drive strength to the external load for achieving optimal rise time of the load line. For low external load, only one inverter may be connected so as to minimize the internal load that limits the rise time, and for high external load, the two inverters may be connected to output 38 and operated in parallel, to achieve maximum driving power.

Preferably the transistor sizes of the multiplexer 12 should be identical to the transistor sizes of multiplexer 22, and the transistor sizes of inverter 52 should be identical to those of inverter 18. Thus, when output 26 is connected to input 54, the elements shown within dotted lines 74 and 76 are identical, with output 19 matching output 56 with same rise time and drive strength. This is important for use with automatic design tools that need to utilize these structures for design implementation, and should be able to select the one or the other inverting multiplexer interchangeably for implementing a given logic function with given characteristics. In contrast, inverter 42 may be selected to be different from the other two inverters. Preferably inverter 42 may have double the transistor size of inverter 52. This may enable a total driving strength of 1×, 2× or 3× of that of the inverter 52 alone to be attained, when connecting the output 38 to input 54 only, to input 44 only or to input 44 and 54 in parallel, respectively.

As can be seen from FIG. 1, additional combinations of the elements are possible beyond those shown in FIGS. 2A and 2B. For example, as a variation of the arrangement of FIG. 2A, output 46 may be connected to input 54, thus achieving a further level of signal inversion. In this arrangement inverters 42 and 52 operate in series.

In another embodiment which may be considered as a variation of the arrangement of FIG. 2B, external signals may be supplied to input 35 and select input 37, in which case the cell may be broken into three parallel elements, e.g. by connecting output 38 to input 44 within dotted lines 78 of FIG. 2B.

Referring now to FIGS. 3, 4A, 4B, & 5 it is appreciated that the connections between the elements of the logic cell for configuring the cell to perform one or more independent logic functions can be realized in several ways. Generally the implementation of the elements of the logic cell shown in FIG. 1 is performed in the bottom layers of the microelectronic device (generally at the semiconductor level, the gate level and at the first metal layer). It may, however, be desirable to implement the connections that select the configuration of the cell in the top metal layer. This involves minimum cost and effort when bug fixes or device iterations are required, as only one photolithographic mask must be re-made and only one metal layer must be re-processed.

In one preferred embodiment the connections identified in FIGS. 2A and 2B by reference numerals 81, 82, 83 and 91 may take the form of metal bridges between terminals located at the top metal layer. These terminals may be connected to metal segments at the bottom of the device that form the inputs and outputs shown schematically in FIG. 1.

The connections between the top layer terminals and the bottom metal inputs and outputs may be realized by standard microfabrication techniques known in the art, such as stacked vias or a cascade of vias extending through the dielectric layers of the multi-layer device and being connected by metal connecting segments in the various metal layers (not shown).

Figure 3:
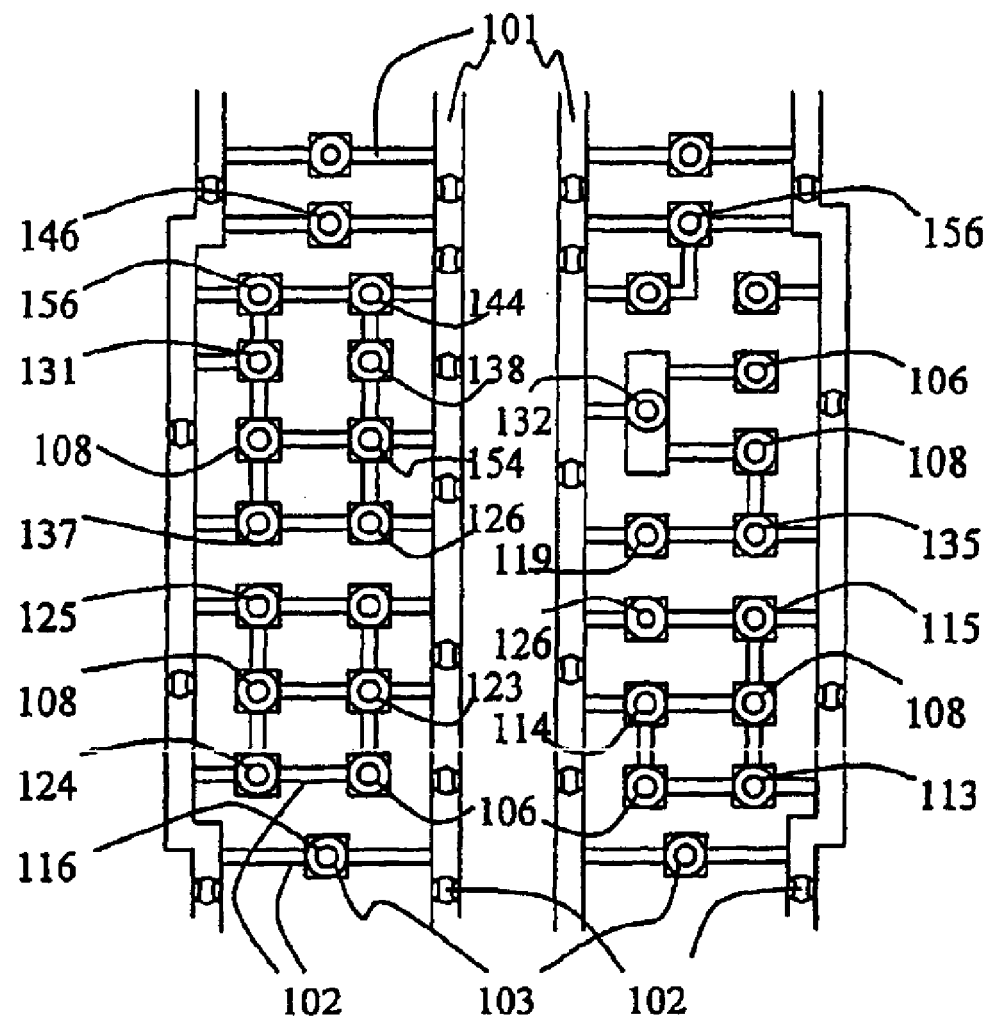
FIG. 3 is a preferred interconnection structure useful in the configuration and customization of the cell structure of FIG. 1.

FIG. 3 shows a section of the top metal layer, which constitutes one preferable interconnection arrangement for configuring the logic cell of FIG. 1. The interconnection arrangement also carries input and output signals to and from the cells, and may be used for programming the functionality of the logic cells. FIG. 3 shows a top metal layer 101 having segments 102 that operate as removable links or as connectable links. Vias 103 are also shown. The vias connect the top metal layer 101 to underlying metal layers (not shown) and also connect to the logic cell inputs and outputs. Specifically, all the inputs and outputs identified by reference numerals in FIG. 1 are connected to corresponding terminals in the top metal layer, which are identified in FIG. 3 by corresponding reference numerals incremented by 100. In addition, reference numerals 106 and 108 in FIG. 3 indicate terminals connected by vias to the Vss potential (logic 0) and Vdd potential (logic 1), respectively.

Figure 4A:
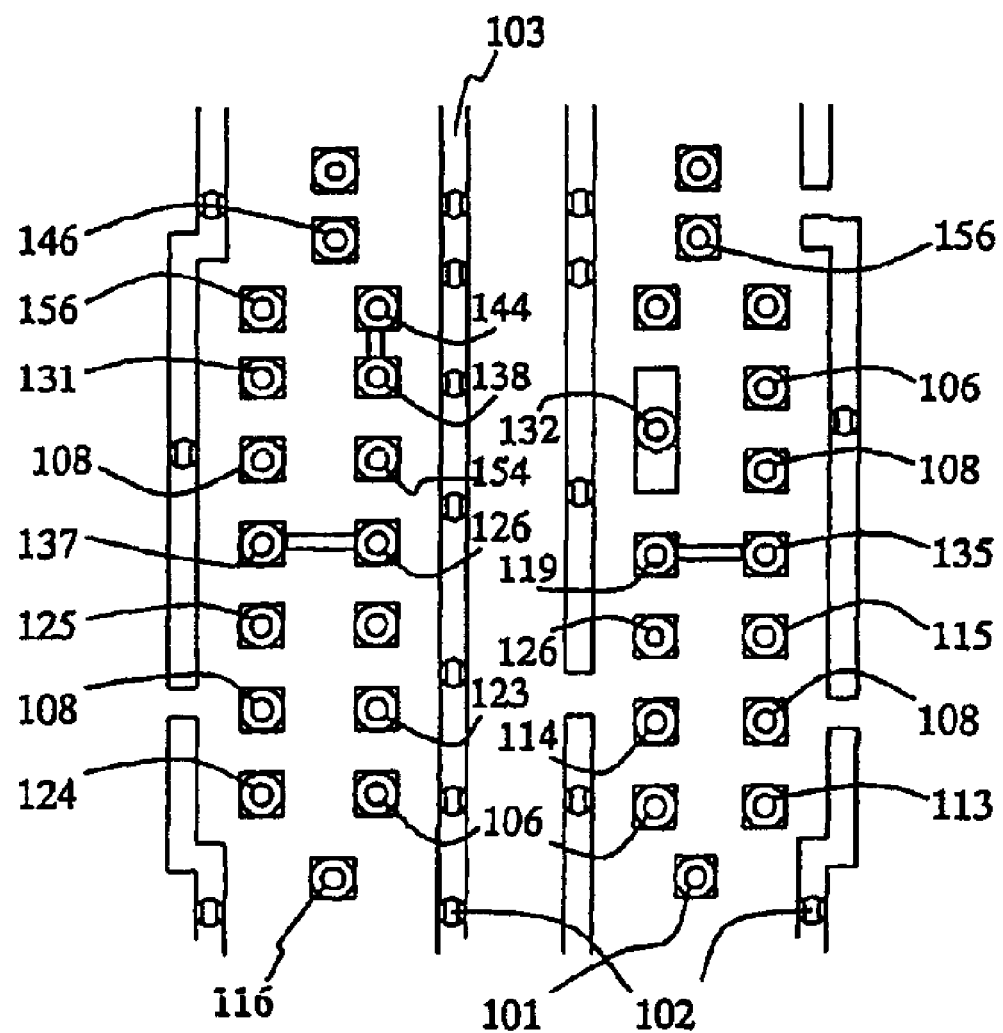
FIG. 4A is a simplified illustration of a preferred customization scheme of the structure of FIG. 3 for implementing the cell configuration of FIG. 2A

FIG. 4A shows an implementation of the connectivity in the top metal for implementing the cell configured in FIG. 2A. In FIG. 4A, a connection is defined between terminals 119 and 135, between terminals 126 and 137 and between terminals 138 and 144, while the connection between terminals 126 and 154 is broken.

Figure 4B:
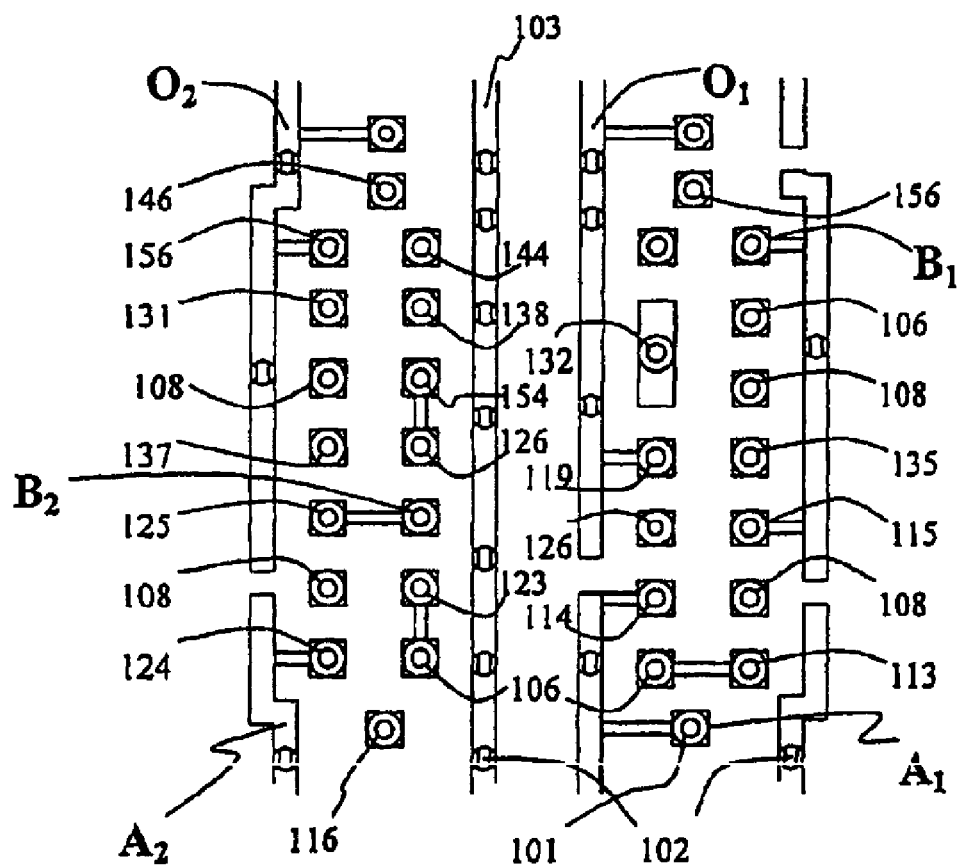
FIG. 4B is a simplified illustration of a preferred customization scheme of the structure of FIG. 3 for implementing the cell configuration of FIG. 2B.
Figure 5:
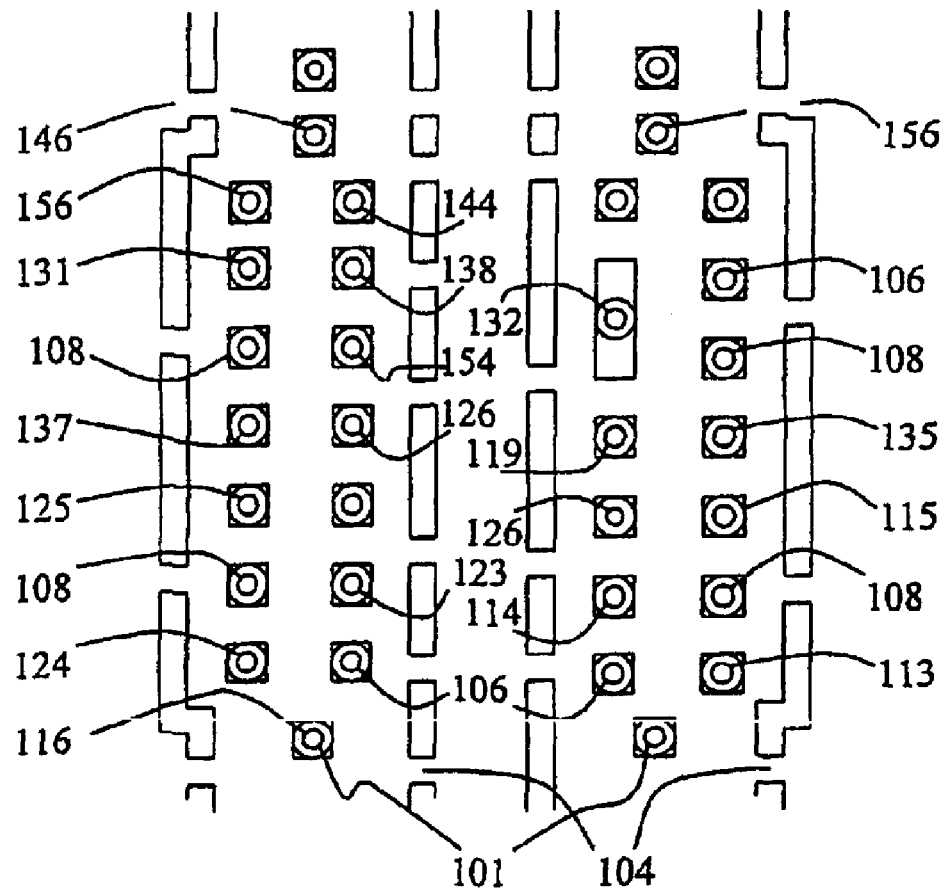
FIG. 5 is another preferred interconnection structure useful in the configuration and customization of the cell structure of FIG. 1.

FIG. 4B shows the implementation of the connectivity in the top metal for implementing the cell configured in FIG. 2B. In FIG. 4B, a connection is defined between terminals 126 and 154, while the connections between terminals 119 and 135 and between terminals 154 and 138 are broken.

It is appreciated that in both FIGS. 4A and 4B, many other connections between various terminals are also broken.

FIG. 4B further illustrates the implementation of two parallel logic NAND functions in the two sub-cells within dotted lines 74 and 76 that are defined by the above connections. In FIG. 4B, a connection is defined between the Vss terminals 106 and terminals 113 and 123, which terminals are connected in turn to the first inputs 13 and 23 of multiplexers 12 and 22, as shown schematically in FIG. 2B.

Signals A1, B1, and A2, B2 are supplied along vias, connected to signal lines in the underlying interconnect layer (not shown), to the multiplexers 12 and 22 of the sub-cells within dotted lines 74 and 76 respectively of FIG. 2B. Thus it may be appreciated that signal A1 is supplied through terminal 114 to input 14 of multiplexer 12, signal B1 is supplied through terminal 115 to input 15 of multiplexer 12, signal A2 is supplied through terminal 124 to input 24 of multiplexer 22 and signal B2 is supplied through terminal 125 to input 25 of multiplexer 22.

FIG. 4B also shows a vertical metal track 103 that is not used for cell configuration or for carrying an input or output signal for this specific cell implementation. This track can be used as a bypass for routing signals between other cells (not shown) located on both sides of the terminal area of the cell shown in FIG. 4B.

The placement of the various terminals need not be limited to the layout shown in FIG. 3. Rather, other placements with different nearest neighbors can be used. Yet, any effective placement should reflect key design considerations. Among the design considerations included in the design shown in FIG. 3 are the placement of Vdd and Vss terminals in proximity to the terminals that are connected to the inputs of the first and second multiplexers 12 and 22 and a terminal that is connected to an input of the NAND gate 30, so as to implement desired input-selectable logic functions. Outputs and inputs of the logic cell for connecting to adjacent logic cells and to a routing grid should be easily accessible. In the design shown in FIG. 3 the terminals are divided into two branches that connect to four vertical metal tracks, for easy access. In particular, terminals 146 and 156 that are connected to the logic cell outputs 46 and 56 respectively, are preferably placed at the top of the terminal structure and on two separate branches, to allow maximum flexibility and minimum interference in connecting the output signals to the interconnect grid (not shown). Extra vias connected to underlying signal lines are preferably placed within the cell terminal area, for easy connection between adjacent cells without utilizing too many metal routing tracks, in order to avoid signal traffic congestion in the configuring metal layer shown in FIGS. 3, 4A & 4B.

Furthermore, terminal 156 is preferably placed in proximity to terminal 131, to provide feedback from output 56 of the logic cell of FIG. 1 to the input 31 of the NAND gate 30 of the same cell, enabling efficient implementation of a sequential flip-flop. While some terminals (such as terminals 106, 108, 126 and 156) are duplicated for easy access, this duplication should be minimized so as to minimize area consumption and unnecessary interference with underlying routing tracks (not shown). Connections between duplicated terminals are performed in the underlying metal layers of the device.

The segments 102 that form the contacts between the terminals may be applied in various ways. In one preferred embodiment these segments may be removable links. In this case, the links are pre-deposited, connecting all terminals together as shown in FIG. 3. In the configuration step the links are broken, e.g. by pulsed laser radiation, or by patterning the top metal and etching away all the undesirable links.

In another preferred embodiment, the top metal may be a blanket metal that connects all the vias 101 together. In this embodiment the blanket metal may be patterned by standard micro-lithography using a mask with the desired connection pattern. After patterning and etching preferably only the connections between the desired vias and between the vias and other signal lines are left in the top metal layer.

In yet another embodiment the segments 102 may be "make-link" segments. In this embodiment, shown in FIG. 5, the metal is produced and patterned without any of the segments 102 in place. Instead, "make-link" sites 104 are disposed in all locations where it may be desired to form links. In the configuration step the links are made selectively by either one of the linking technologies known in the art e.g. by local metal deposition, by laser induced linking, or by electric field induced linking.

In yet another preferred embodiment, the vias 101 themselves may be configurable. In this embodiment, in the configuration step, both the upper via layer and the top metal layer are patterned and etched by standard lithographic techniques. This embodiment requires two application specific lithographic masks for configuration (e.g. a via mask and a top-metal layer mask). Considering simplicity, speed of configuration and cost of configuration, configuring the upper via and any additional layer besides the top metal is inferior to top-metal-only configuration as in the previously described embodiments.

However, when other layers besides the top metal layer participate in the configuration step, enhanced device density may be achieved, since only the necessary vias are deposited and additional metal signal lines can now be provided in the area that was otherwise occupied by unnecessary or unused via terminals.

In yet another preferred embodiment, the configurable metal layer need not be the top metal layer. Rather, one of the intermediate metal layers of the multi-metal layer device may be chosen for configuring the cells. The advantage of using an intermediate metal layer for configuration is that the configuring layer can be accessed from both metal layers above it and below it, allowing a higher level of flexibility and connectivity in the routing process. In this case the terminals shown in FIGS. 3 & 5 will still be connected to vias, but these vias may lead to either a metal layer above the configuring layer or to a metal layer underneath it. When the configuration step is carried out by using standard photolithography followed by metal etching, the ability to configure the device by modifying the layout of only a single metal layer provides significant savings in photolithographic mask costs.

In particular, the configuring layer may be the lowest metal layer of the device, lying just over the metal layer used to implement the circuit elements of the logic cell. This has the added advantage of minimizing the length of stacked vias that may be necessary in order to connect the cell inputs and outputs to its terminals in the configuring layer. This helps to reduce resistivity, improve device speed and reliability and minimize interference with the metal interconnection grid.

Figure 6:
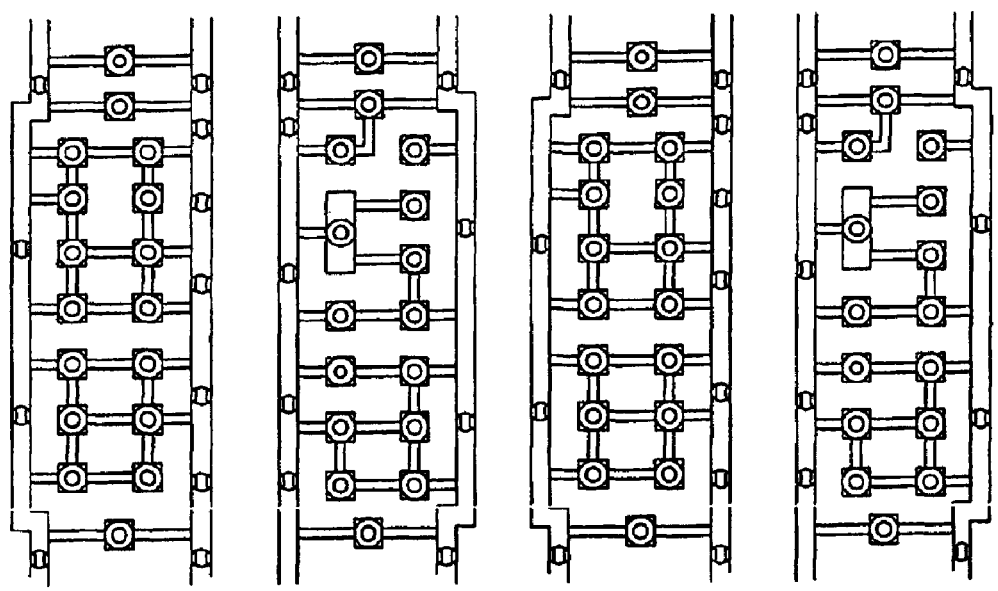
FIG. 6 is a simplified illustration of part of the configurable metal layer of a gate array comprising cells of the type illustrated in FIG. 1.

In gate array structures the logic cells and the overlying metal structure are tiled and repeated over a large area, a portion of such area shown schematically in FIG. 6. However, the repetitive structure of the logic cells may cover only a portion of the total device. Other elements such as I/O cells, memory cells, inverters, analogue structures, busses and other special designs for implementing interfaces with other components and implementing intellectual property blocks may co-exist with the tiled logic array structure.

Figure 7:
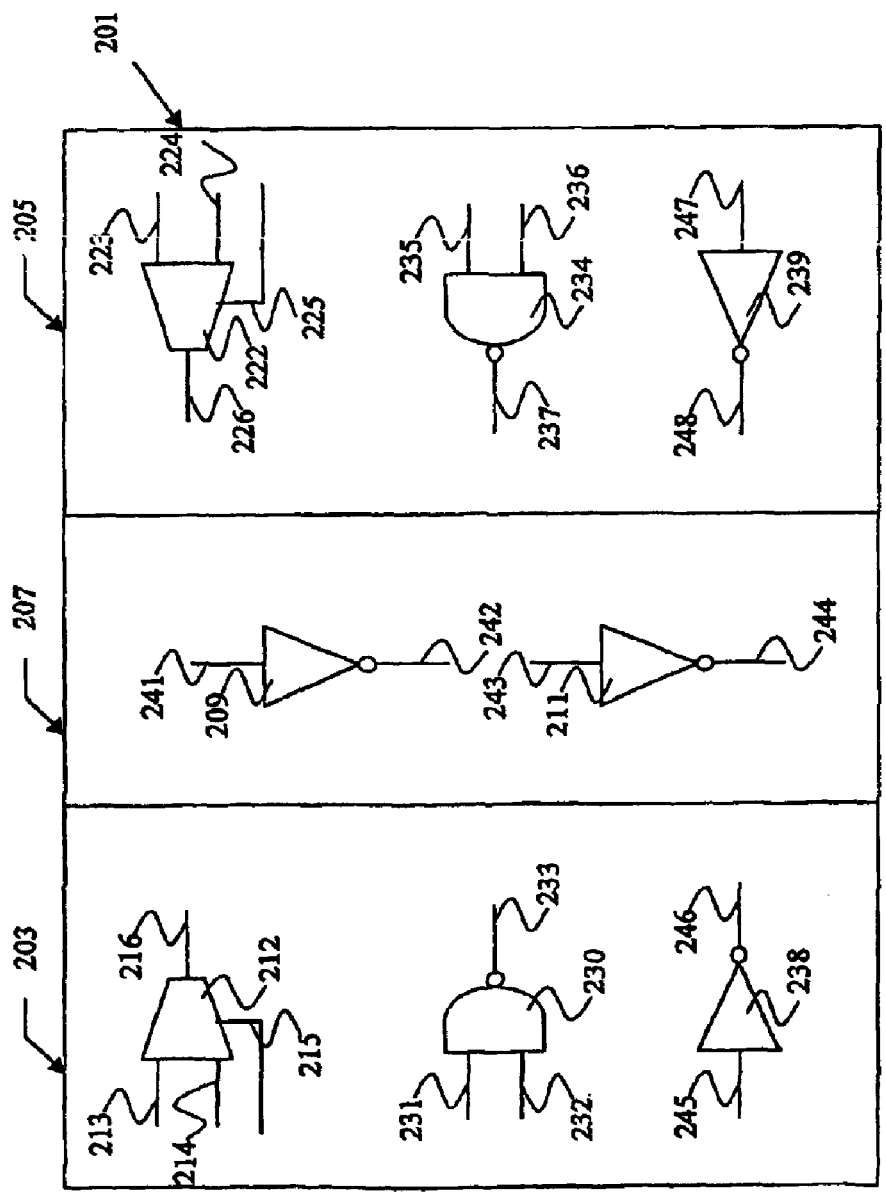
FIG. 7 is a simplified schematic illustration of a base cell constructed and operative in accordance with another preferred embodiment of the present invention.

Reference is now made to FIG. 7, which illustrates a logic cell 201 constructed and operative in accordance with a preferred embodiment of the present invention. The unit logic cell comprises multiple circuit elements, generally similar to those illustrated in U.S. Pat. No. 5,684,412, but with a major distinction that the various elements are not fixedly connected to each other. Rather, the connections between the elements can be reconfigured, as will be described below. As distinct from the single unit logic cell 1 of FIG. 1 described hereinabove, the logic cell 201 of FIG. 7 is preferably constructed of a pair of identical logic portions 203 and 205 which are preferably located on opposite sides of a driver portion 207, which preferably includes a first driver 209 having an input 241 and an output 242 and second driver 211 having an input 243 and an output 244.

Logic portion 203 preferably comprises a first multiplexer 212, having first and second inputs 213 and 214, a select input 215 and an output 216, while identical logic portion 205 preferably comprises a second multiplexer 222 having first and second inputs 223 and 224, a select input 225 and an output 226.

Logic portion 203 also preferably comprises a first NAND gate 230 having inputs 231 and 232 and an output 233, while identical logic portion 205 preferably comprises a second NAND gate 234, having inputs 235 and 236 and an output 237.

Logic portion 203 also preferably comprises a first inverter 238 having an input 245 and an output 246, while identical logic portion 205 preferably comprises a second inverter 239, having an input 247 and an output 248.

It is a particular feature of the invention exemplified in FIG. 7 that each input and each output of each element therein may be connected to any other input or output of any other element of the same or a different cell, preferably at the same metal layer.

Figure 8A:
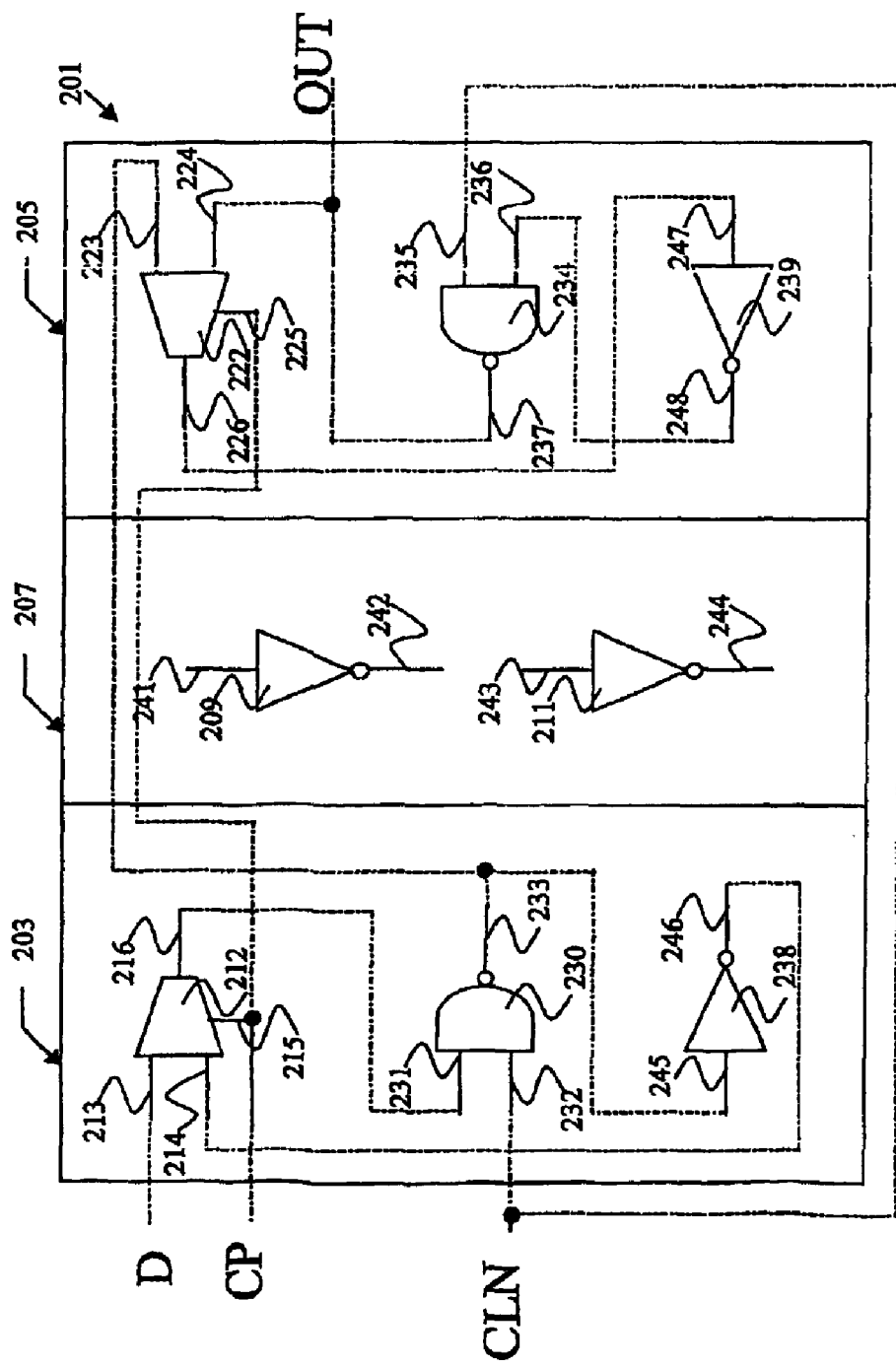
FIG. 8A is a simplified illustration of one flip-flop configuration of the cell of FIG. 7.

Reference is now made to FIG. 8A, which shows one flip-flop configuration of the cell of FIG. 7. It is seen that input 213 of multiplexer 212 is designated as a data input D. The select inputs 215 and 225 of respective multiplexers 212 and 222 are interconnected and designated as clock inputs CP. Inputs 232 and 235 of respective NAND gates 230 and 234 are interconnected and designated as clear inputs CLN.

The output 216 of multiplexer 212 is connected to input 231 of NAND gate 230. The output 246 of inverter 238 is connected to input 214 of multiplexer 212. The output 233 of NAND gate 230 is connected to the input 245 of inverter 238 and to input 223 of multiplexer 222. The output 226 of multiplexer 222 is connected to the input 247 of inverter 239. The output 248 of inverter 239 is connected to input 236 of NAND gate 234.

The output 237 of NAND gate 234 is connected to input 224 of multiplexer 222 and defines the output OUT of the data flip flop defined by the structure of FIG. 8A.

Figure 8B:
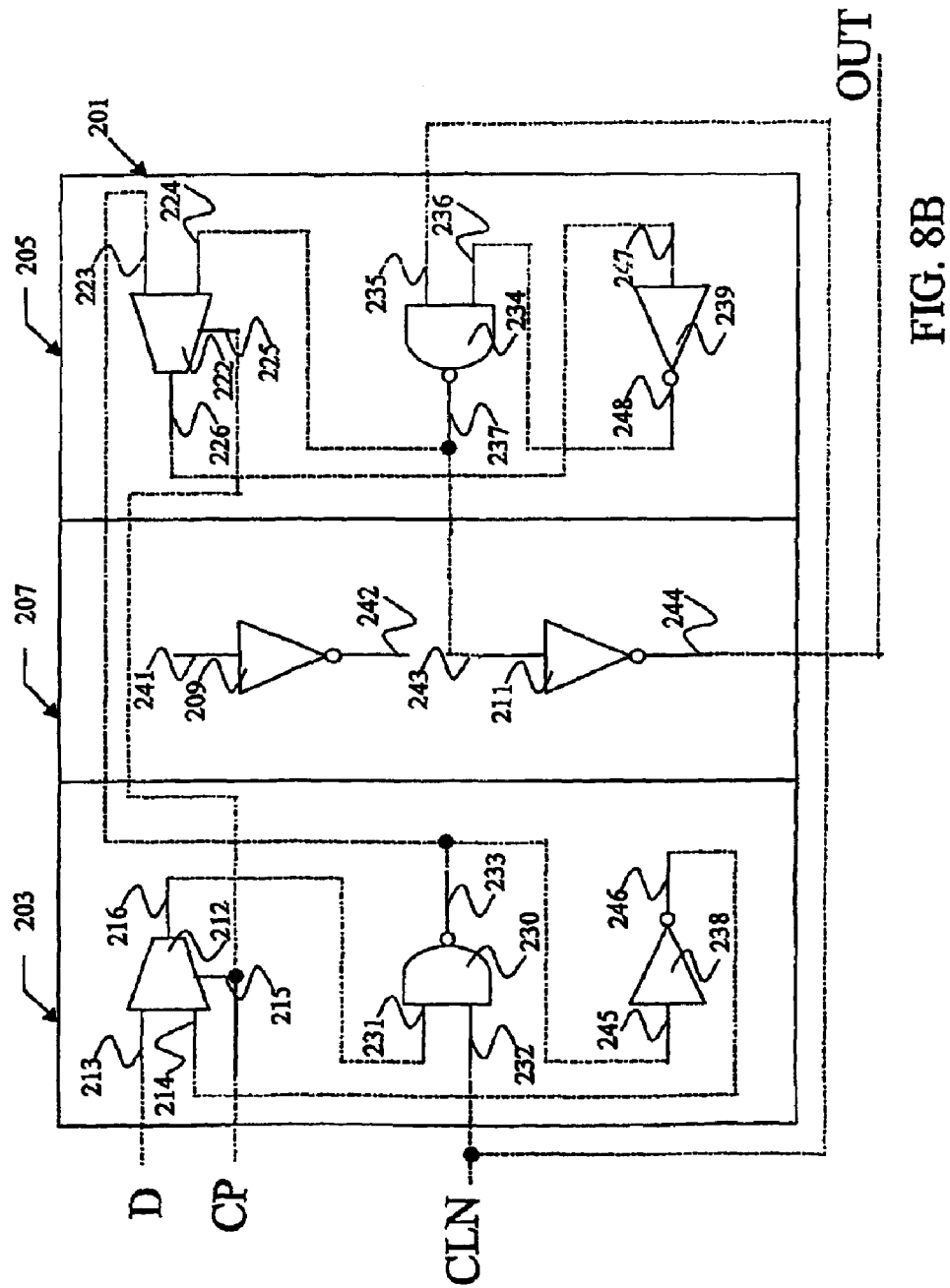
FIG. 8B is a simplified illustration of another flip-flop configuration of the cell of FIG. 7.

Reference is now made to FIG. 8B, which shows another flip-flop configuration of the cell of FIG. 7, characterized in that it employs a driver having higher current capacity than that employed in the embodiment of FIG. 8A. It is seen that as in the embodiment of FIG. 8A, input 213 of multiplexer 212 is designated as a data input D. The select inputs 215 and 225 of respective multiplexers 212 and 222 are interconnected and designated as clock inputs CP. Inputs 232 and 235 of respective NAND gates 230 and 234 are interconnected and designated as clear inputs CLN.

The output 216 of multiplexer 212 is connected to input 231 or NAND gate 230. The output 246 of inverter 238 is connected to input 214 of multiplexer 212. The output 233 of NAND gate 230 is connected to the input 245 of inverter 238 and to input 223 of multiplexer 222. Output 226 of multiplexer 222 is connected to the input 247 of inverter 239. The output 248 of inverter 239 is connected to input 236 of NAND gate 234.

As distinct from the embodiment of FIG. 8A, here output 237 of NAND gate 234, connected to input 224 of multiplexer 222, is also connected to the input 243 of driver 211, whose output 244 defines the output OUT of the data flip flop defined by the structure of FIG. 8B.

Figure 8C:
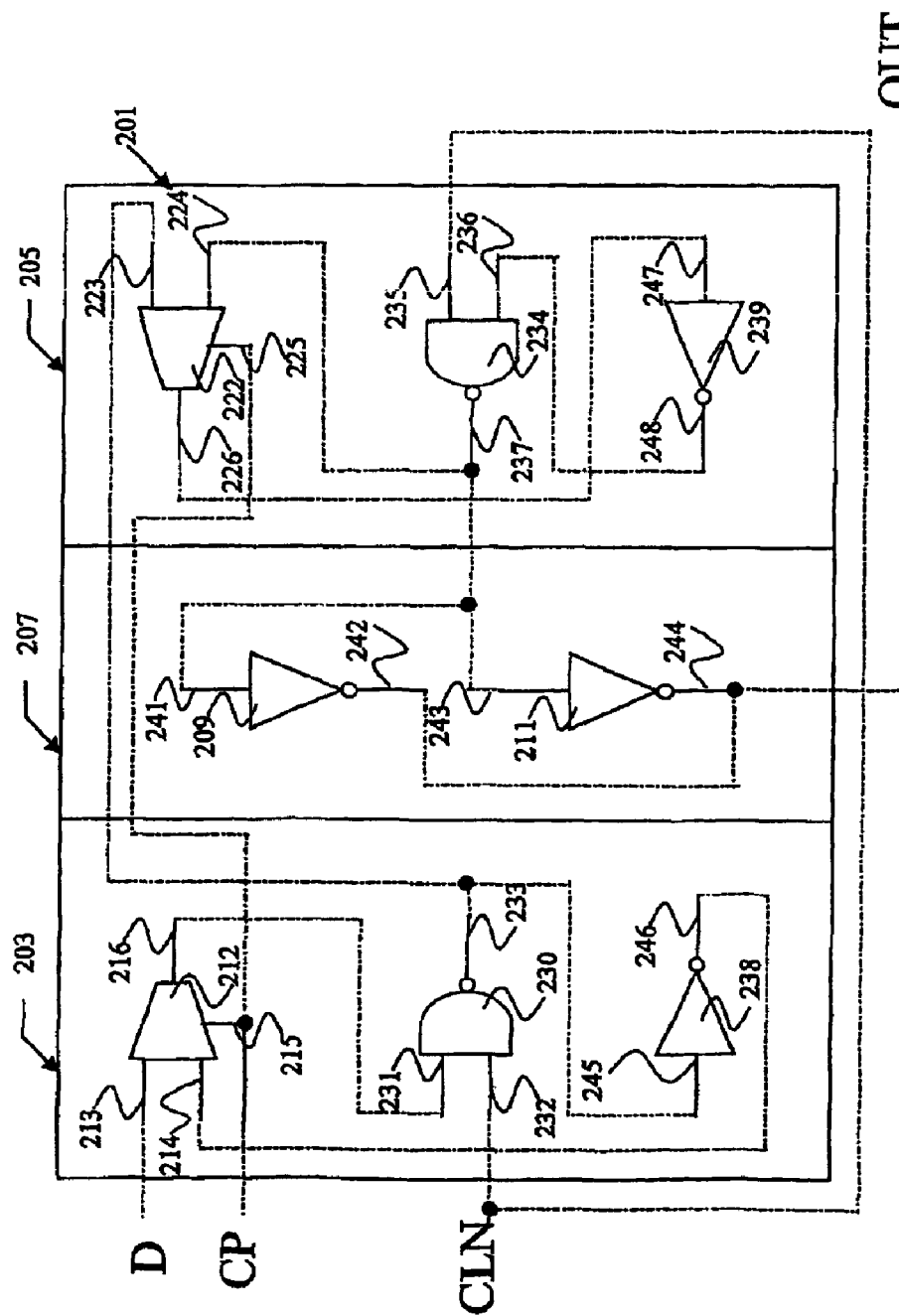
FIG. 8C is a simplified illustration of yet another flip-flop configuration of the cell of FIG. 7.

Reference is now made to FIG. 8C, which shows yet other flip-flop configuration of the cell of FIG. 7 characterized in that it employs a driver having even higher current capacity than that employed in the embodiment of FIG. 8B. It is seen that as in the embodiment of FIGS. 8A and 8B, input 213 of multiplexer 212 is designated as a data input D. The select inputs 215 and 225 of respective multiplexers 212 and 222 are interconnected and designated as clock inputs CP. Inputs 232 and 235 of respective NAND gates 230 and 234 are interconnected and designated as clear inputs CLN.

The output 216 of multiplexer 212 is connected to input 231 or NAND gate 230. The output 246 of inverter 238 is connected to input 214 of multiplexer 212. The output 233 of NAND gate 230 is connected to the input 245 of inverter 238 and to input 223 of multiplexer 222. The output 226 of multiplexer 222 is connected to the input 247 of inverter 239. The output 248 of inverter 239 is connected to input 236 of NAND gate 234.

As distinct from the embodiment of FIG. 8B, here output 237 of NAND gate 234, connected to input 224 of multiplexer 222, is also connected to the inputs 241 and 243 of respective drivers 209 and 211, whose respective outputs 242 and 244 are connected to each other and together define the output OUT of the data flip flop defined by the structure of FIG. 8C.

Figure 9A:
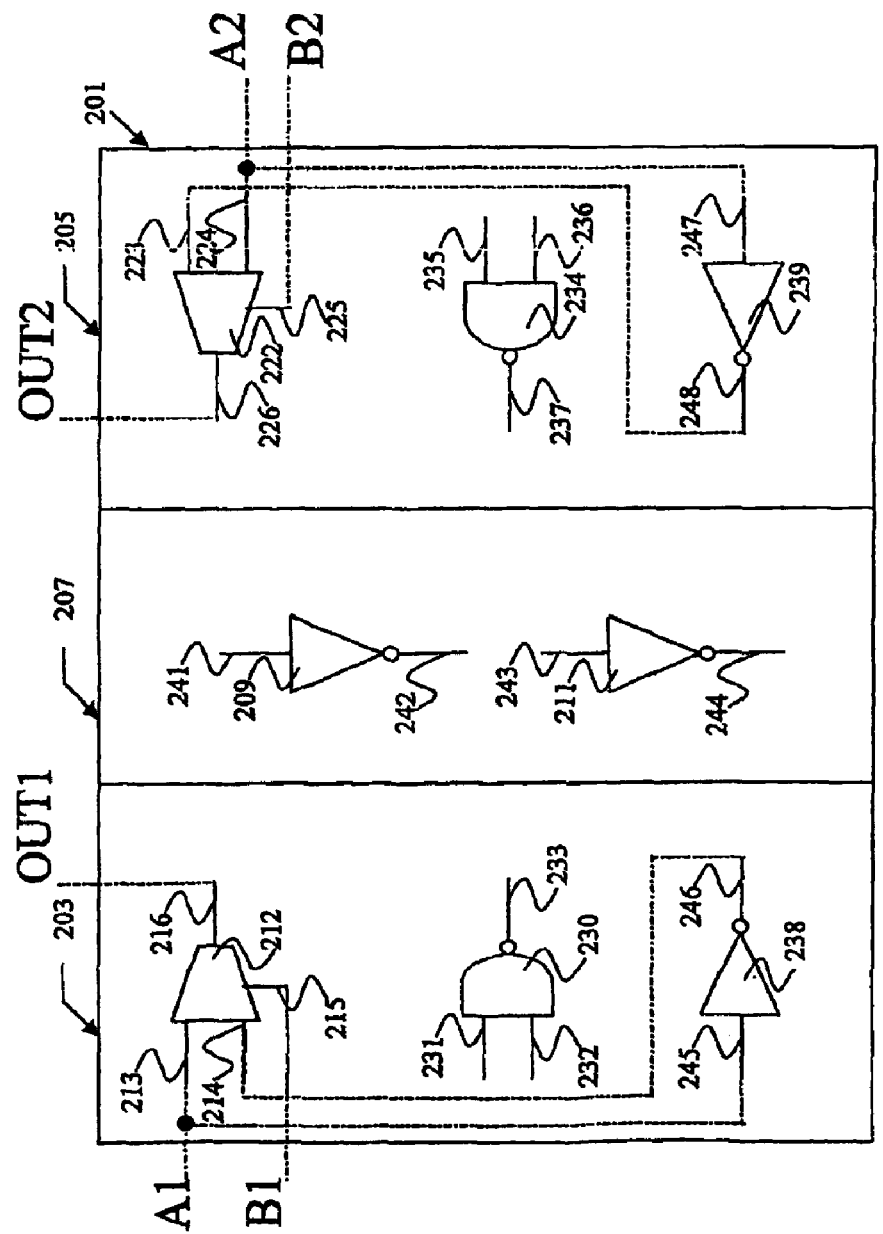
FIG. 9A is a simplified illustration of one XOR—XOR configuration of the cell of FIG. 7.

Reference is now made to FIG. 9A, which shows one XOR—XOR configuration of the cell of FIG. 7, wherein logic portions 203 and 205 each define a XOR circuit It is seen that the input 213 of multiplexer 212 and the input 245 of inverter 238 are interconnected and designated as a data input A1. The select input 215 of multiplexer 212 is designated as a data input B1. The output 246 of inverter 238 is connected to input 214 of multiplexer 212. The output 216 of multiplexer 212 defines the output OUT1 of a first XOR circuit defined by the structure of FIG. 9A.

Input 224 of multiplexer 222 and the input 247 of inverter 239 are interconnected and designated as a data input A2. The select input 225 of multiplexer 222 is designated as a data input B2. The output 248 of inverter 239 is connected to input 223 of multiplexer 222. The output 226 of multiplexer 222 defines the output OUT2 of another XOR circuit defined by the structure of FIG. 9A.

Figure 9B:
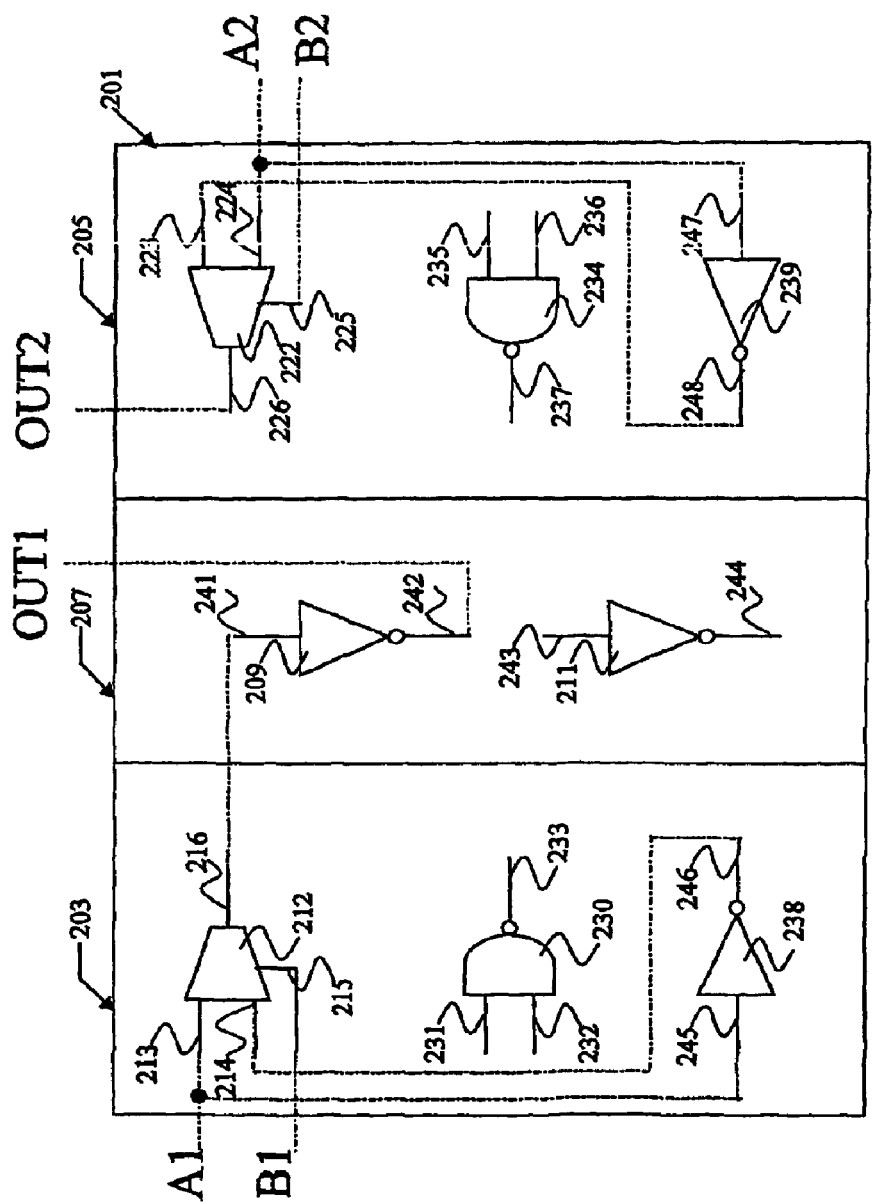
FIG. 9B is a simplified illustration of a XNOR-XOR configuration of the cell of FIG. 7.

Reference is now made to FIG. 9B, which shows a XNOR-XOR configuration of the cell of FIG. 7, wherein logic elements 203 and 205 respectively define a XNOR circuit and an XOR circuit and characterized in that the XNOR circuit employs a driver having higher current capacity than that employed in the embodiment of FIG. 9A. It is seen that as in the embodiment of FIG. 9A, the input 213 of multiplexer 212 and the input 245 of inverter 238 are interconnected and designated as a data input A1. The select input 215 of multiplexer 212 is designated as data input B1. The output 246 of inverter 238 is connected to input 214 of multiplexer 212.

As distinct from the embodiment of FIG. 9A, here output 216 of multiplexer 212 is connected to the input 241 of driver 209, whose output 242 defines the output OUT1 of a XNOR circuit defined by the structure of FIG. 9B.

It is also seen that as in the embodiment of FIG. 9A, input 224 of multiplexer 222 and the input 247 of inverter 239 are interconnected and designated as a data input A2. The select input 225 of multiplexer 222 is designated as a data input B2. The output 248 of inverter 239 is connected to input 223 of multiplexer 222. Output 226 of multiplexer 222 defines the output OUT2 of a XOR circuit defined by the structure of FIG. 9B.

Figure 9C:
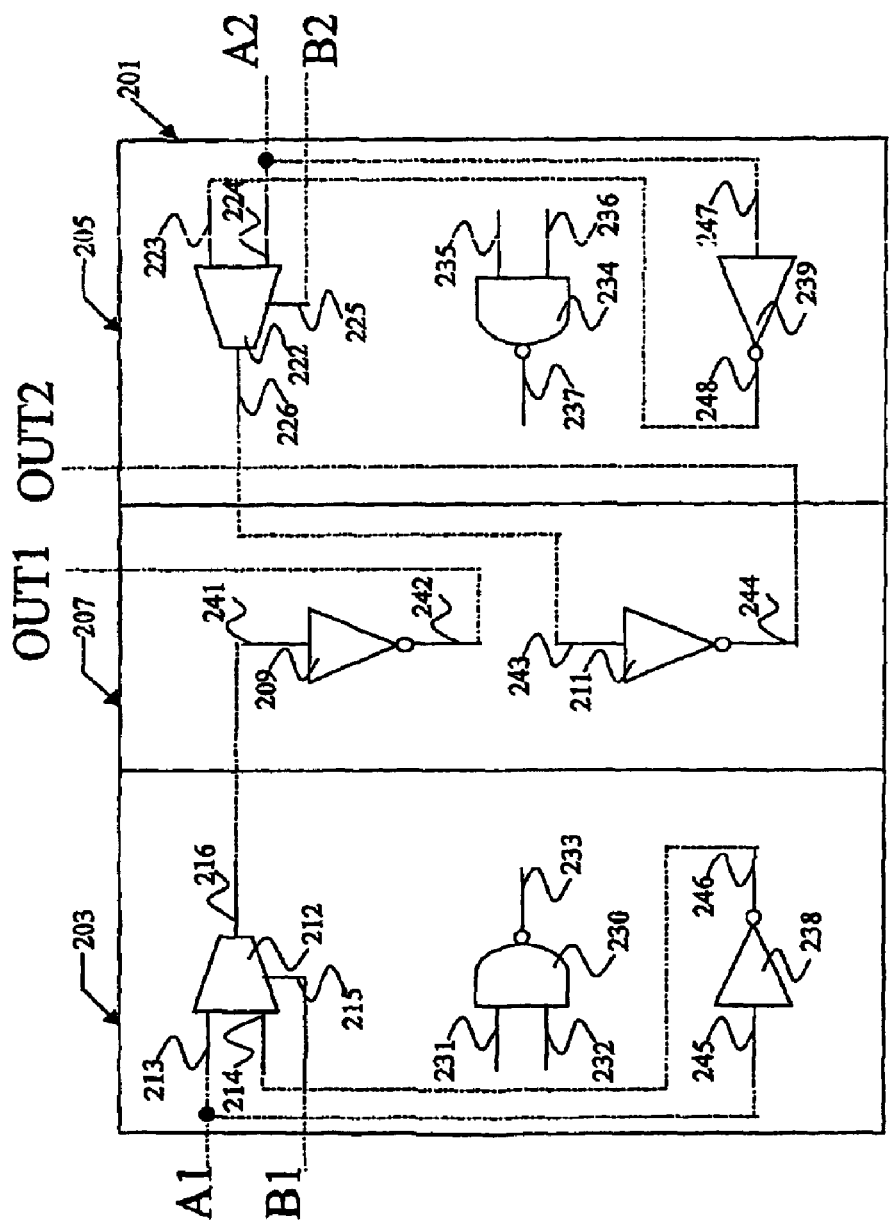
FIG. 9C is a simplified illustration of a XNOR—XNOR configuration of the cell of FIG. 7.

Reference is now made to FIG. 9C, which shows a XNOR—XNOR configuration of the cell of FIG. 7 in which logic elements 203 and 205 are both XNOR circuits and also characterized in that the XNOR circuit defined by element 203 employs a driver having higher current capacity than that employed in the embodiment of FIG. 9B. It is seen that as in embodiment of FIG. 9B, input 213 of multiplexer 212 and the input 245 of inverter 238 are interconnected and designated as a data input A1. The select input 215 of multiplexer 212 is designated as a data input B1. The output 246 of inverter 238 is connected to input 214 of multiplexer 212. Output 216 of multiplexer 212 is connected to the input 241 of driver 209, whose output 242 defines the output OUT1 of a first XNOR circuit defined by the structure of FIG. 9C.

Input 224 of multiplexer 222 and input 247 of inverter 239 are interconnected and designated as a data input A2. The select input 225 of multiplexer 222 is designated as a data input B2. The output 248 of inverter 239 is connected to input 223 of multiplexer 222.

As distinct from the embodiment of FIG. 9B, here output 226 of multiplexer 222 is connected to the input 243 of driver 211, whose output 244 defines the output OUT2 of a second XNOR circuit defined by the structure of FIG. 9C.

Figure 9D:
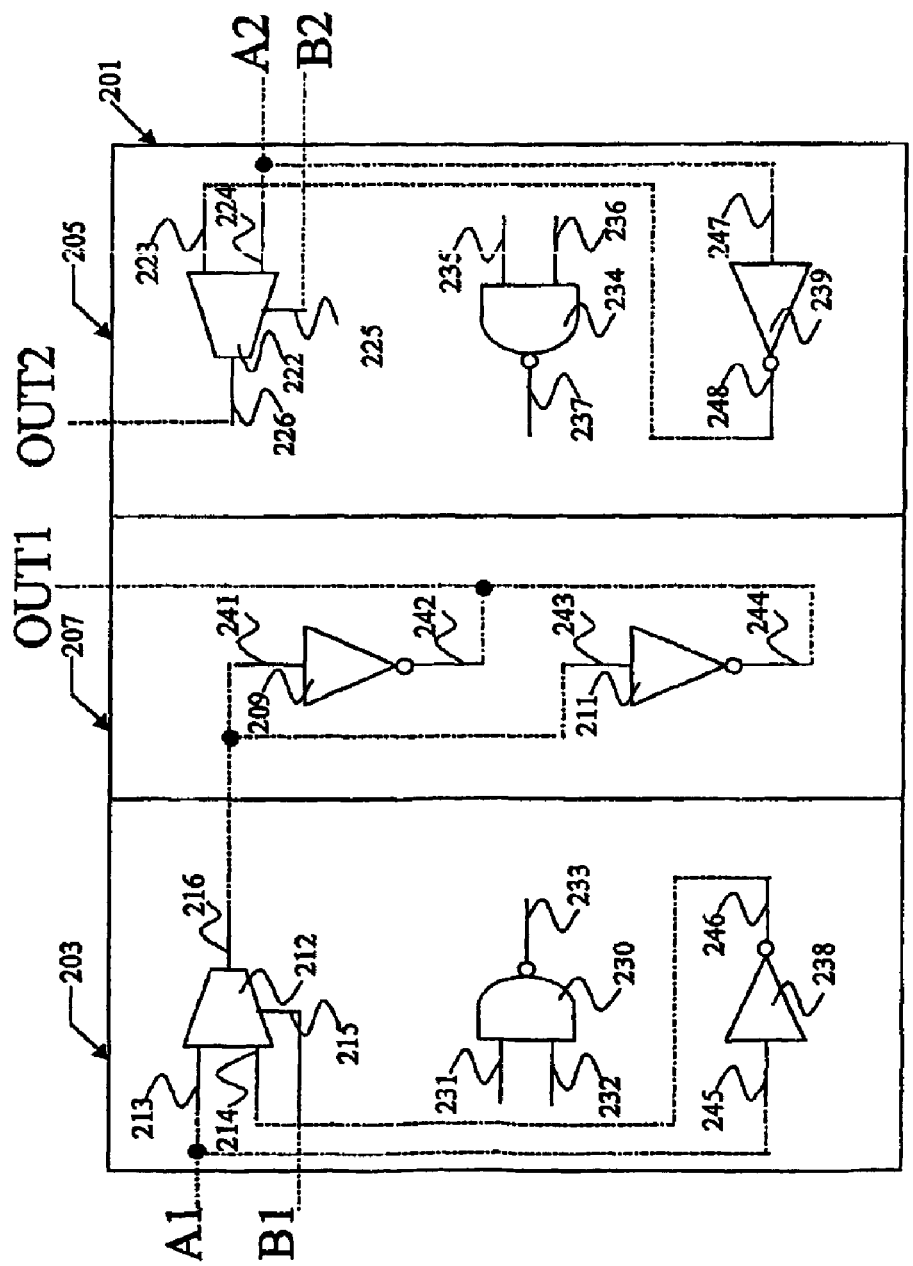
FIG. 9D is a simplified illustration of another XNOR-XOR configuration of the cell of FIG. 7.

Reference is now made to FIG. 9D, which shows another XNOR-XOR configuration of the cell of FIG. 7 wherein logic element 203 is a XNOR circuit and logic element 205 is a XOR circuit and characterized in that the XNOR circuit employs a driver having even higher current capacity than that employed in the embodiment of FIG. 9B. It is seen that as in the embodiment of FIG. 9B, input 213 of multiplexer 212 and input 245 of inverter 238 are interconnected and designated as a data input A1. The select input 215 of multiplexer 212 is designated as a data input B1. The output 246 of inverter 238 is connected to input 214 of multiplexer 212.

As distinct from the embodiment of FIG. 9B, here output 216 of multiplexer 212 is connected to the inputs 241 and 243 of respective drivers 209 and 211, whose outputs 242 and 244 are connected to each other and together define an output OUT1 of a XNOR circuit defined by output OUT2 of a XOR circuit defined by the structure of FIG. 9D.

It is also seen that as in embodiment of FIG. 9B, input 224 of multiplexer 222 and input 247 of inverter 239 are interconnected and designated as a data input A2. The select input 225 of multiplexer 222 is designated as a data input B2. The output 248 of inverter 239 is connected to the input 223 of multiplexer 222. Output 226 of multiplexer 222 defines an output OUT2 of a XOR circuit defined by the structure of FIG. 9D.

Reference is now made to FIGS. 10, 11A–11C and 12A–12D, which show a preferred interconnection structure useful in the configuration and customization of the cell structure of FIG. 7. It is appreciated that the connections between the elements of a logic cell for configuring the cell to perform one or more independent logic functions can be realized in several ways. Generally the implementation of the elements of the logic cell shown in FIG. 7 is performed in the bottom layers of the microelectronic device (generally at the semiconductor level, the gate level and at the first metal layer). It may, however, be desirable to implement the connections that select the configuration of the cell in the top metal layer. This involves minimum cost and effort when bug fixes or device iterations are required, as only one photolithographic mask must be re-made and only one metal layer must be re-processed.

In one preferred embodiment the connections shown in FIGS. 8A–8C and 9A–9D may take the form of metal bridges between terminals located at the top metal layer. These terminals may be connected to metal segments at the bottom of the device that form the inputs and outputs shown schematically in FIG. 7.

The connections between the top layer terminals and the bottom metal inputs and outputs may be realized by standard microfabrication techniques known in the art, such as stacked vias or a cascade of vias extending through the dielectric layers of the multi-layer device and being connected by metal connecting segments in the various metal layers (not shown).

Figure 10:
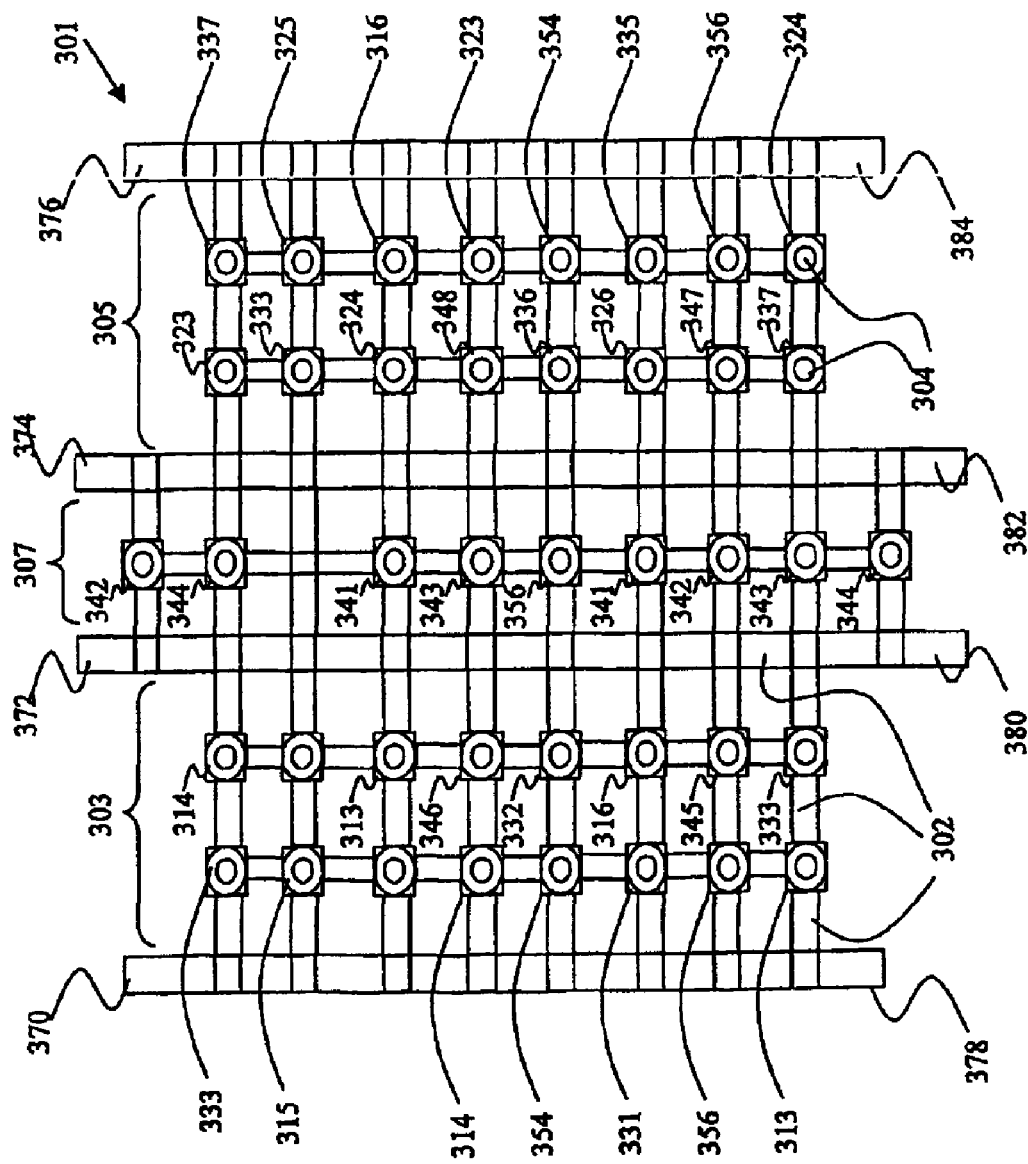
FIG. 10 is a preferred interconnection structure useful in the configuration and customization of the cell structure of FIG. 7.

FIG. 10 shows a section of the top metal layer, which constitutes one preferable interconnection arrangement for configuring the logic cell of FIG. 10. The interconnection arrangement also carries input and output signals to and from the cell, and may be used for programming the functionality of the logic cell. FIG. 7 shows a top metal layer 301 having segments 302 that operate as removable links or as connectable links. Vias 304 are also shown. The vias connect the top metal layer 301 to underlying metal layers (not shown) and also connected to logic cell inputs/outputs 370, 372, 374, 376, 378, 380, 382 and 384. Specifically, all the inputs and outputs identified by reference numerals in FIG. 7 preferably are connected to corresponding terminals in the top metal layer, which are identified in FIG. 10 by corresponding reference numerals incremented by 100. In addition, reference numerals 354 and 356 in FIG. 10 indicate terminals connected by vias to the Vss potential (logic 0) and Vdd potential (logic 1), respectively.

Figure 11A:
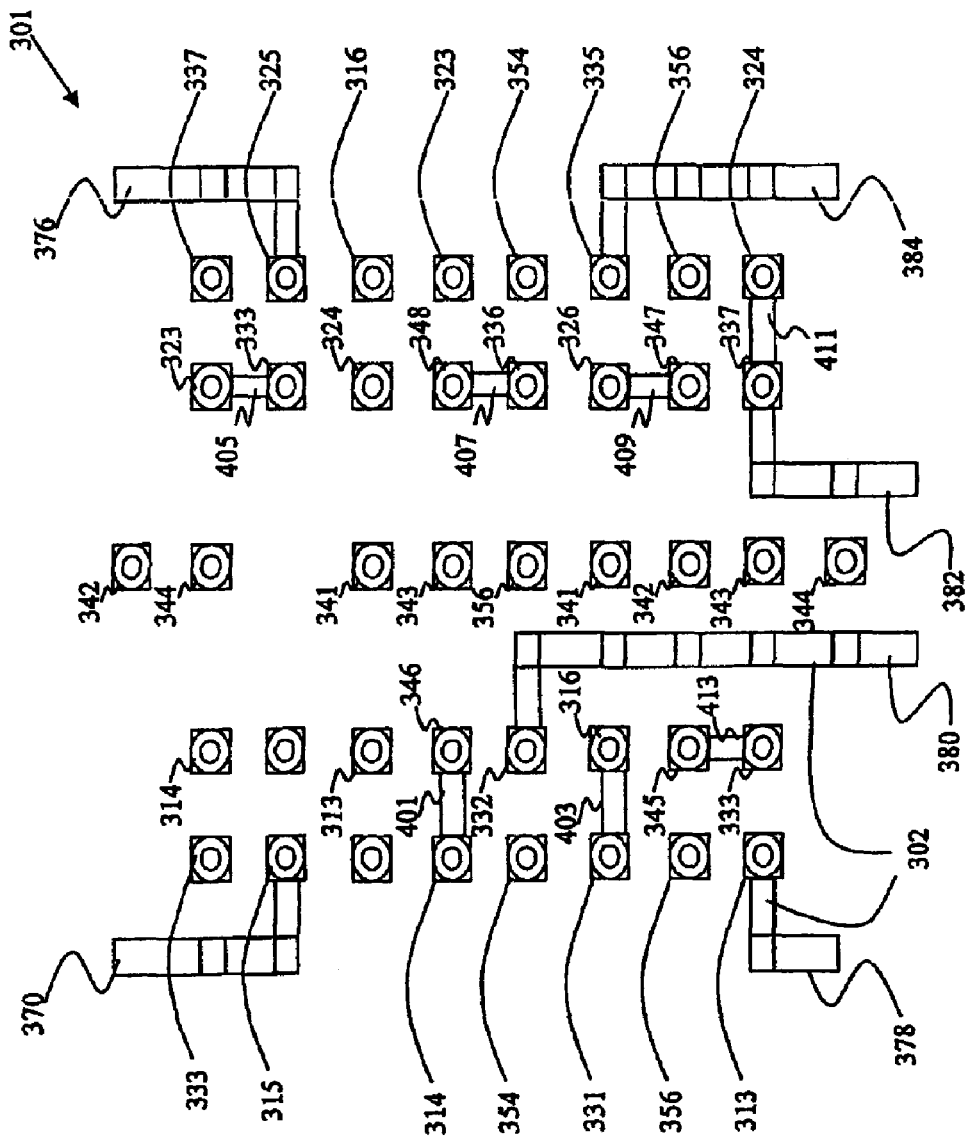
FIG. 11A is a simplified illustration of a preferred customization scheme of the structure of FIG. 10 for implementing the cell configuration of FIG. 8A.

Reference is now made to FIG. 11A which is a simplified illustration of a preferred customization of the structure of FIG. 10 for implementing the cell configuration of FIG. 8A. In FIG. 11A, a connection 401 is defined between a terminal 314 and a terminal 346; a connection 403 is defined between a terminal 331 and a terminal 316; a connection 405 is defined between a terminal 323 and a terminal 333; a connection 407 is defined between a terminal 348 and a terminal 336; a connection 409 is defined between a terminal 326 and a terminal 347; a connection 411 is defined between a terminal 337 and a terminal 324 and a connection 413 is defined between another terminal 333 and a terminal 345.

Connections are defined between a logic input 370 and a terminal 315; between a logic input 378 and a terminal 313; between a logic input 380 and a terminal 332; between a terminal 337 and a logic output 382; between a logic input 384 and a terminal 335 and between a logic input 376 and a terminal 325.

Figure 11B:
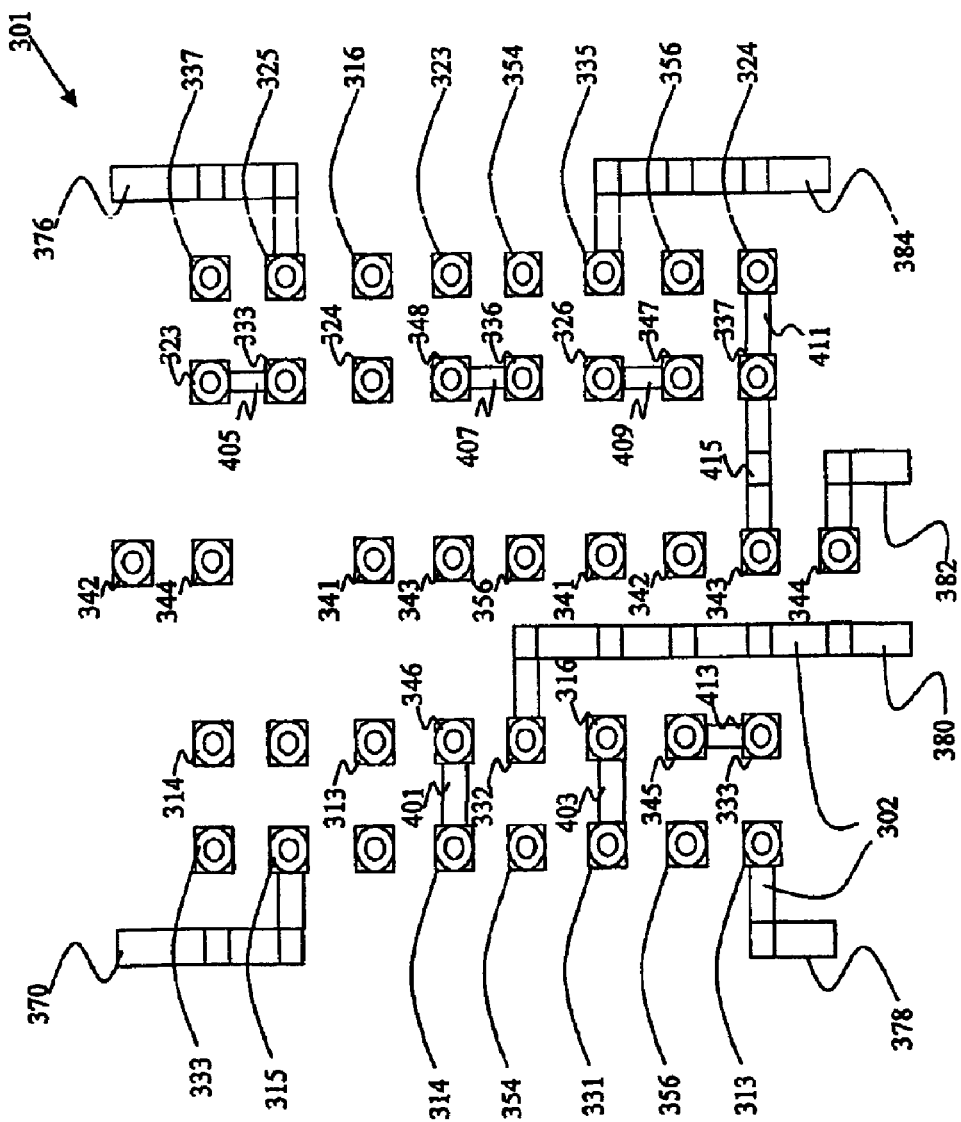
FIG. 11B is a simplified illustration of a preferred customization scheme of the structure of FIG. 10 for implementing the cell configuration of FIG. 8B.

Reference is now made to FIG. 11B which is a simplified illustration of a preferred customization of the structure of FIG. 10 for implementing the cell configuration of FIG. 8B. In FIG. 11B, similarly to FIG. 11A, a connection 401 is defined between a terminal 314 and a terminal 346; a connection 403 is defined between a terminal 331 and a terminal 316; a connection 405 is defined between a terminal 323 and a terminal 333; a connection 407 is defined between a terminal 348 and a terminal 336; a connection 409 is defined between a terminal 326 and a terminal 347; a connection 411 is defined between a terminal 337 and a terminal 324 and a connection 413 is defined between another terminal 333 and a terminal 345. Connections are defined between a logic input 370 and a terminal 315; between a logic input 378 and a terminal 313; between a logic input 380 and a terminal 332; between a logic input 384 and a terminal 335 and between a logic input 376 and a terminal 325.

In contrast to that shown in FIG. 11A, the connection between a terminal 337 and a logic output 382 is replaced by a connection 415 between a terminal 337 and a terminal 343 and by a connection between a terminal 344 and a logic output 382.

Figure 11C:
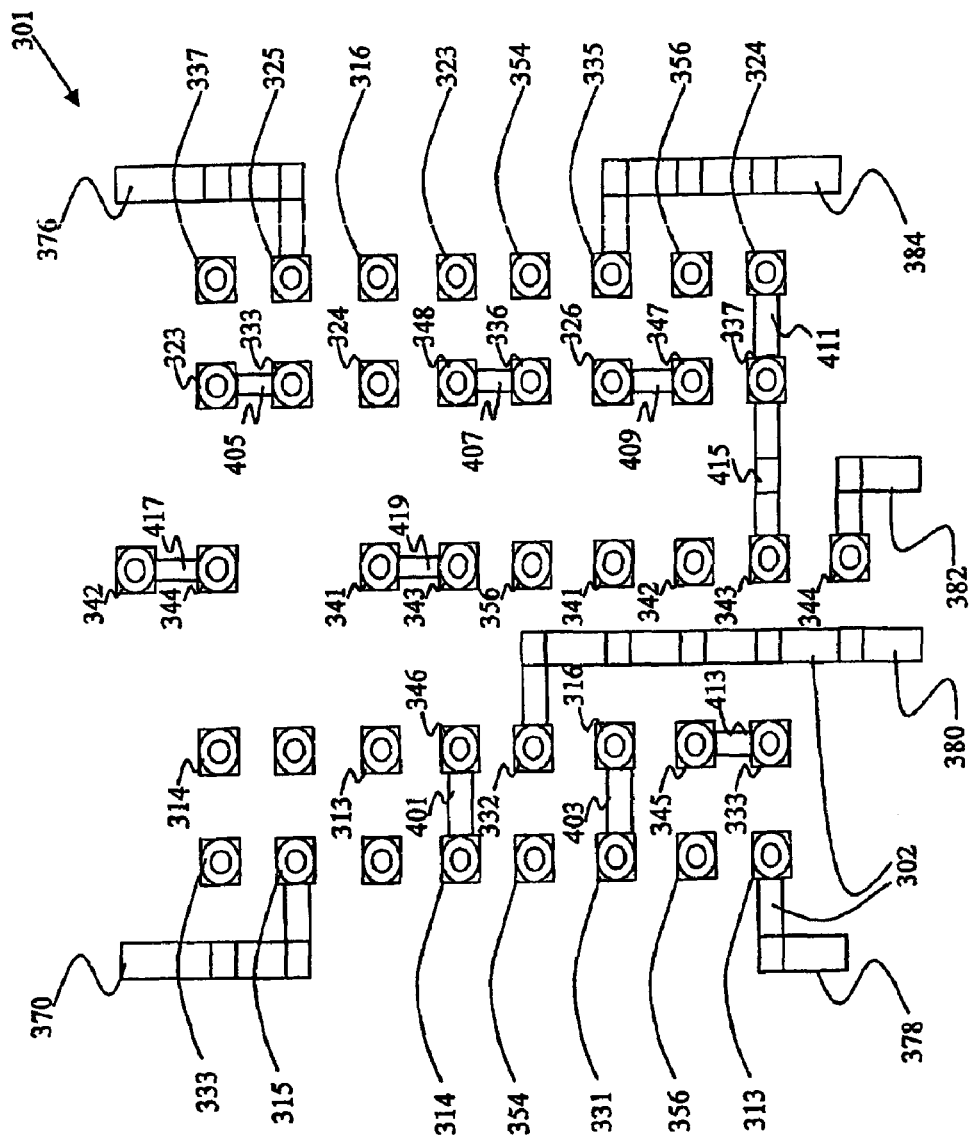
FIG. 11C is a simplified illustration of a preferred customization scheme of the structure of FIG. 10 for implementing the cell configuration of FIG. 8C.

Reference is now made to FIG. 11C which is a simplified illustration of a preferred customization of the structure of FIG. 10 for implementing the cell configuration of FIG. 8C. In FIG. 11C, similarly to FIG. 11B, a connection 401 is defined between a terminal 314 and a terminal 346; a connection 403 is defined between a terminal 331 and a terminal 316; a connection 405 is defined between a terminal 323 and a terminal 333; a connection 407 is defined between a terminal 348 and a terminal 336; a connection 409 is defined between a terminal 326 and a terminal 347; a connection 411 is defined between a terminal 337 and a terminal 324 and a connection 413 is defined between another terminal 333 and a terminal 345. Connections are defined between a logic input 370 and a terminable 315; between a logic input 378 and a terminal 313; between a logic input 380 and a terminal 332; between a logic input 384 and a terminal 335 and between a logic input 376 and a terminal 325. A connection 415 is defined between a terminal 337 and a terminal 343 and a connection is defined between a terminal 344 and a logic output 382.

In contrast to that shown in FIG. 11B, an additional connection 417 is defined between a terminal 342 and another terminal 344 and an additional connection 419 is defined between another terminal 341 and a terminal 343.

Figure 12A:
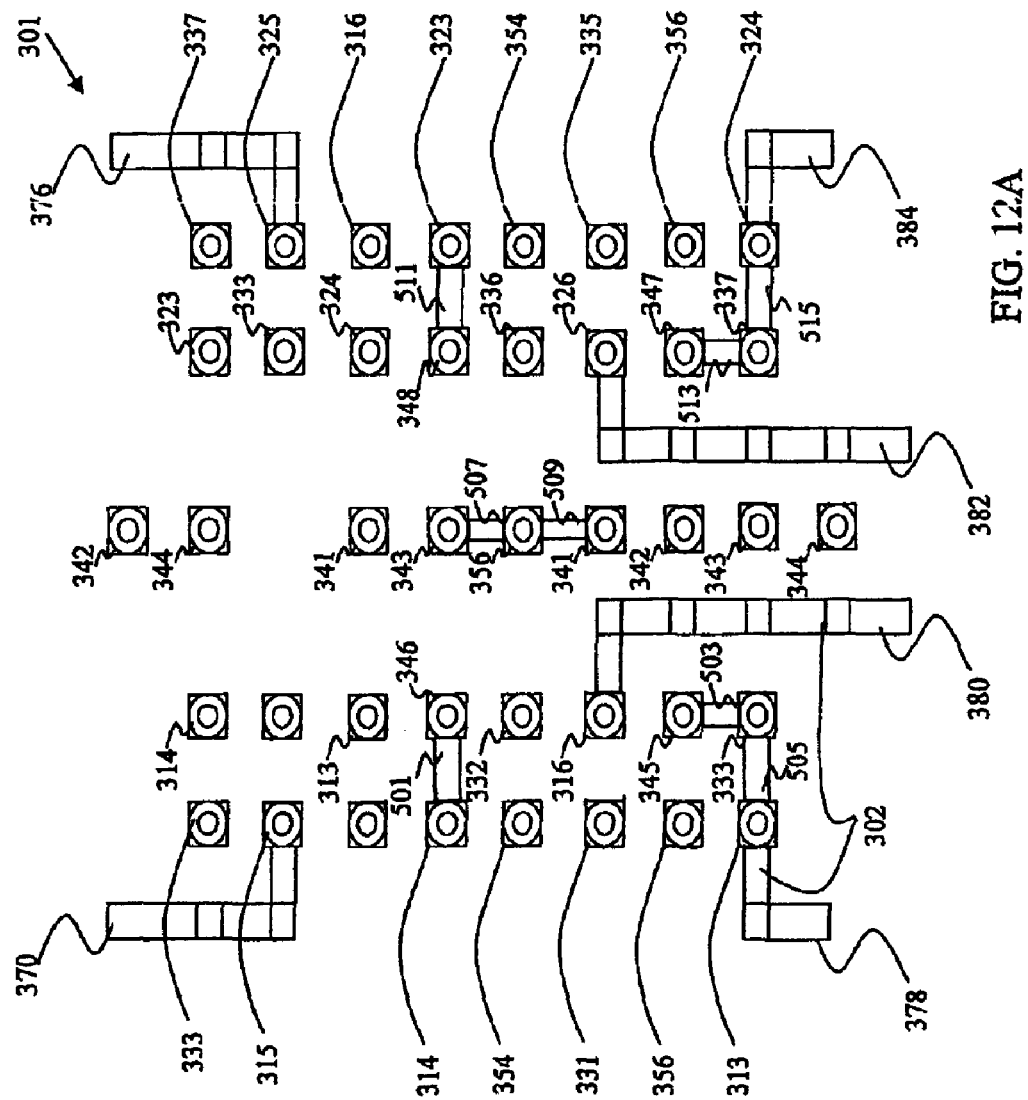
FIG. 12A is a simplified illustration of a preferred customization scheme of the structure of FIG. 10 for implementing the cell configuration of FIG. 9A.

Reference is now made to FIG. 12A which is a simplified illustration of a preferred customization of the structure of FIG. 10 for implementing the cell configuration of FIG. 9A. In FIG. 12A, a connection 501 is defined between a terminal 314 and a terminal 346; a connection 503 is defined between a terminal 345 and a terminal 333; a connection 505 is defined between a terminal 313 and a terminal 333; a connection 507 is defined between a terminal 343 and a terminal 356; a connection 509 is defined between a terminal 356 and a terminal 341; a connection 511 is defined between a terminal 348 and a terminal 323; a connection 513 is defined between a terminal 347 and a terminal 337 and a connection 515 is defined between terminal 337 and a terminal 345.

Connections are defined between a logic input 370 and a teal 315; between a logic input 378 and a terminal 313; between a terminal 316 and a logic output 380 and; between a terminal 326 and a logic output 382; between a logic input 384 and a terminal 324 and between a logic input 376 and a terminal 325.

Figure 12B:
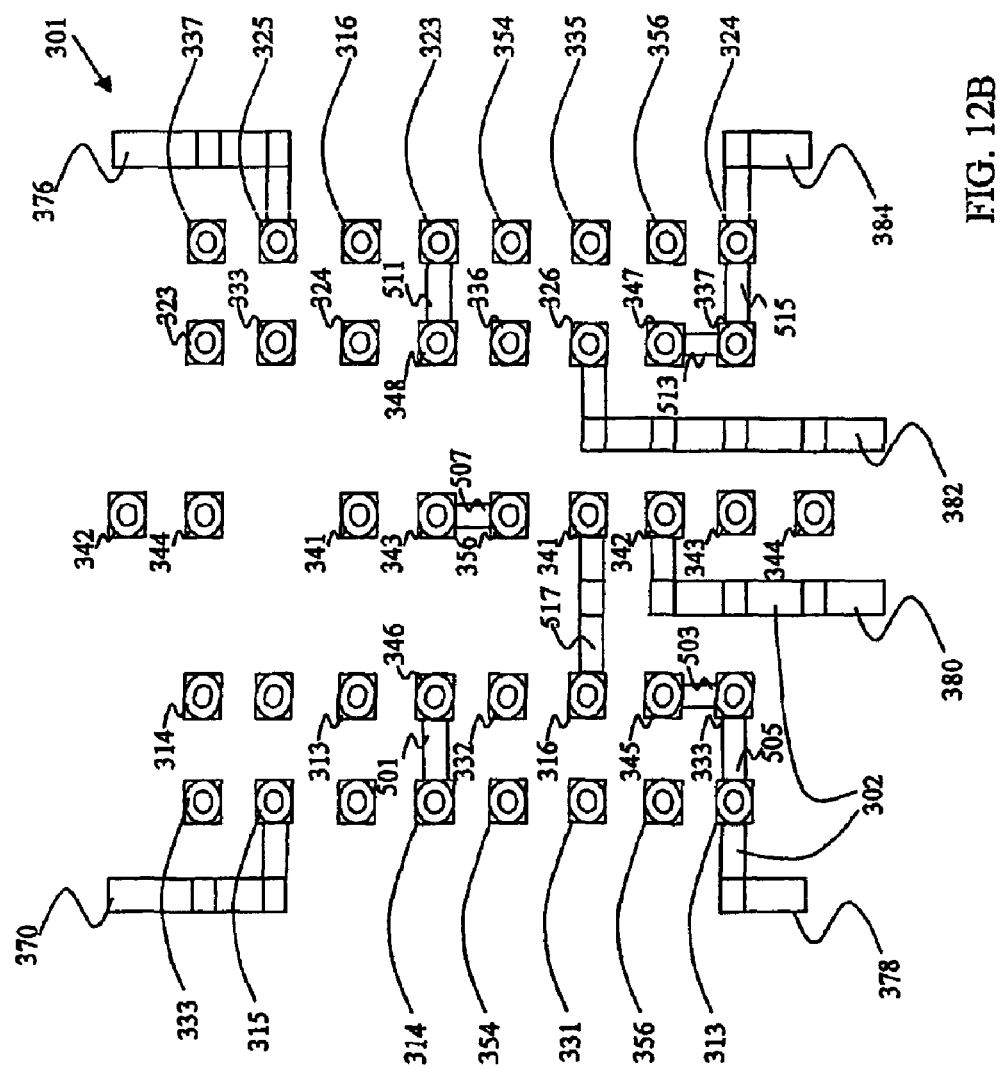
FIG. 12B is a simplified illustration of a preferred customization scheme of the structure of FIG. 10 for implementing the cell configuration of FIG. 9B.

Reference is now made to FIG. 12B which is a simplified illustration of a preferred customization of the structure of FIG. 10 for implementing the cell configuration of FIG. 9B. In FIG. 12B, similarly to FIG. 12A, a connection 501 is defined between a terminal 314 and a terminal 346; a connection 503 is defined between a terminal 345 and a terminal 333; a connection 505 is defined between a terminal 313 and a terminal 333; a connection 507 is defined between a terminal 343 and a terminal 356; a connection 511 is defined between a terminal 348 and a terminal 323; a connection 513 is defined between a terminal 347 and a terminal 337 and a connection 515 is defined between terminal 337 and a terminal 345.

Connections are defined between a logic input 370 and a terminal 315; between a logic input 378 and a terminal 313; between a terminal 326 and a logic output 382; between a logic input 384 and a terminal 324 and between a logic input 376 and a terminal 325.

In contrast to that shown in FIG. 12A, the connection 509 between a terminal 356 and a terminal 341 is eliminated and the connection between terminal 316 and logic output 380 is replaced by a connection 517 between a terminal 316 and a terminal 341 and by a connection between a terminal 342 and a logic output 380.

Figure 12C:
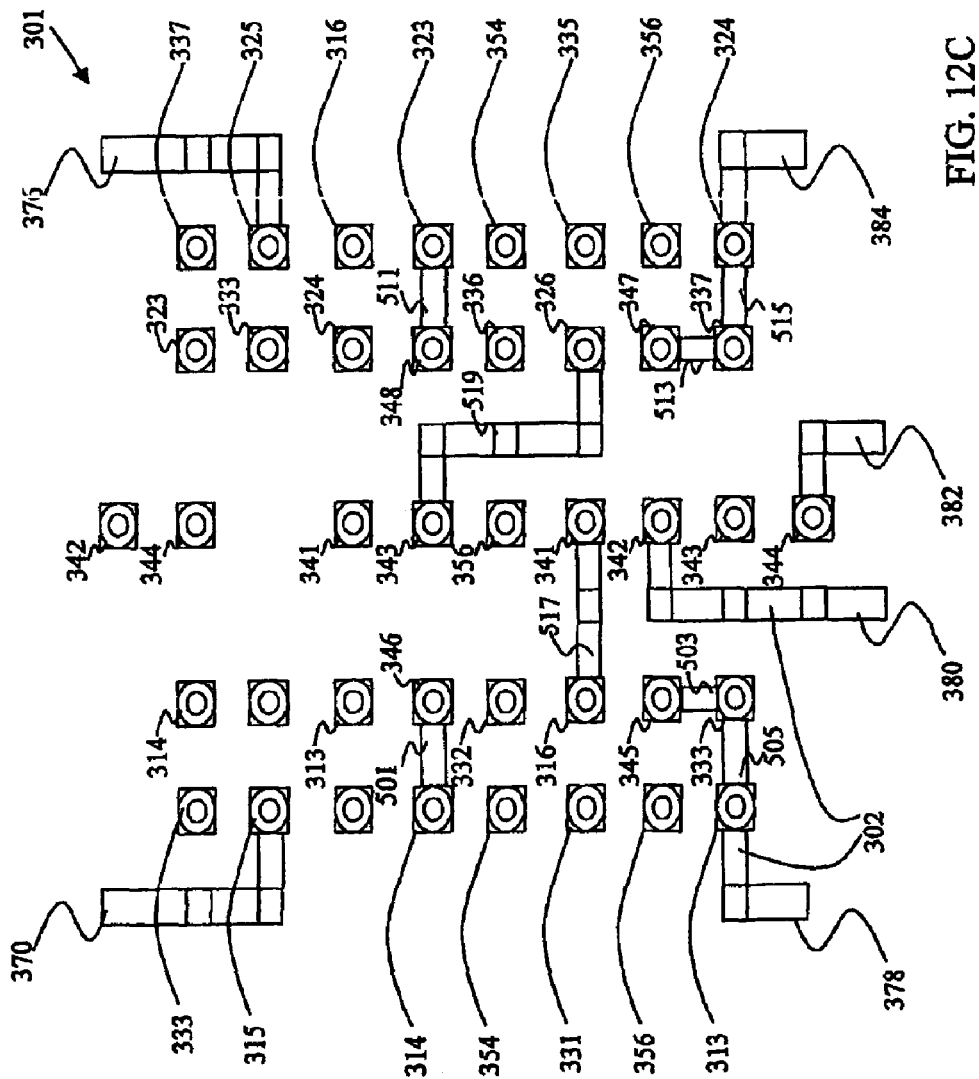
FIG. 12C is a simplified illustration of a preferred customization scheme of the structure of FIG. 10 for implementing the cell configuration of FIG. 9C.

Reference is now made to FIG. 12C which is a simplified illustration of a preferred customization of the structure of FIG. 10 for implementing the cell configuration of FIG. 9C. In FIG. 12C, similarly to FIG. 12B, a connection 501 is defined between a terminal 314 and a terminal 346; a connection 503 is defined between a terminal 345 and a terminal 333; a connection 505 is defined between a terminal 313 and a terminal 333; a connection 511 is defined between a terminal 348 and a terminal 323; a connection 513 is defined between a terminal 347 and a terminal 337 and a connection 515 is defined between terminal 337 and a terminal 345. Connections are defined between a logic input 370 and a terminal 315; between a logic input 378 and a terminal 313; between a logic input 384 and a terminal 324 and between a logic input 376 and a terminal 325. A connection 517 is defined between a terminal 316 and a terminal 341 and a connection is defined between a terminal 342 and a logic output 380.

In contrast to that shown in FIG. 12B, connection 507 between terminal 343 and terminal 356 is eliminated and the connection between terminal 326 and logic output 382 is replaced by a connection 519 between terminal 326 and a terminal 343 and by a connection between a terminal 344 and logic output 382.

Figure 12D:
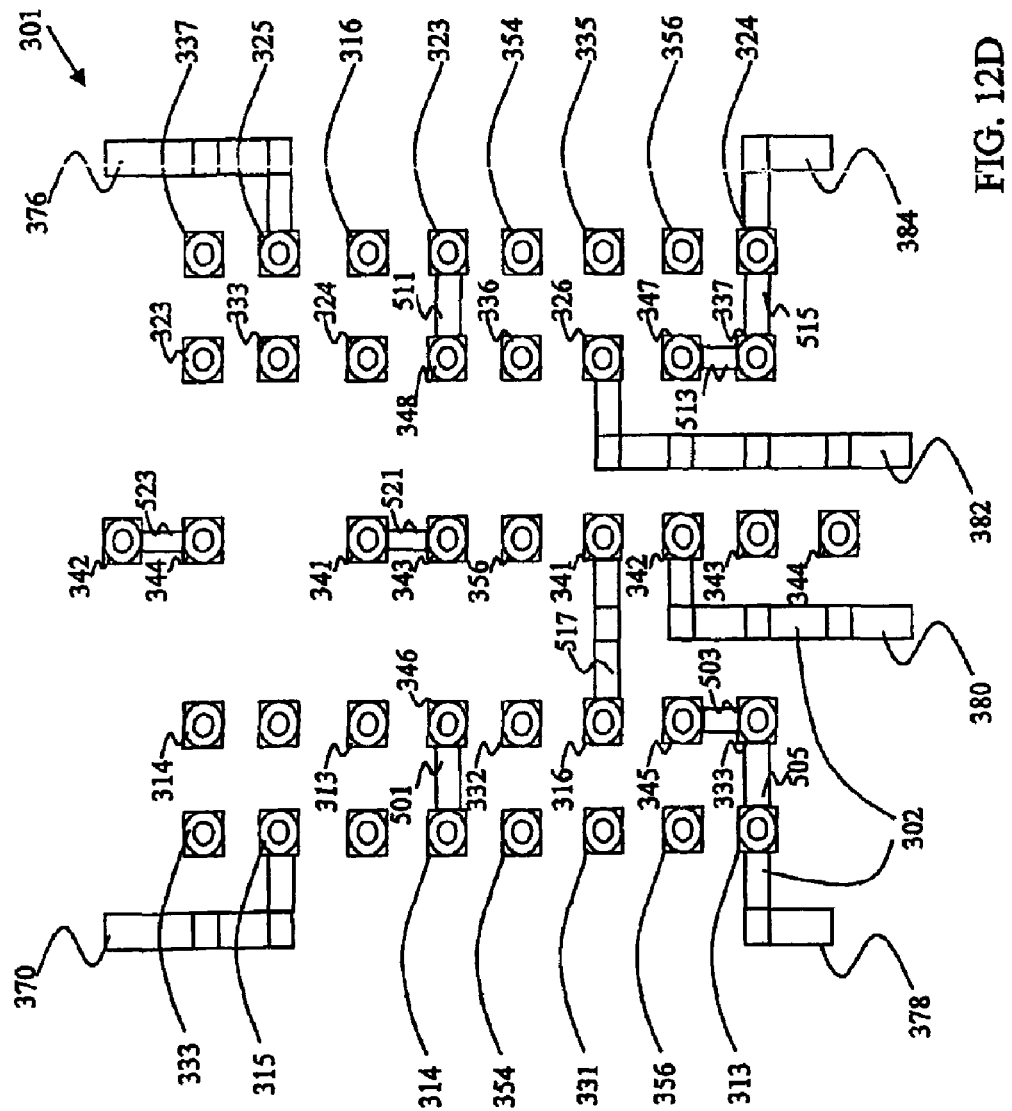
FIG. 12D is a simplified illustration of a preferred customization scheme of the structure of FIG. 10 for implementing the cell configuration of FIG. 9D.

Reference is now made to FIG. 12D which is a simplified illustration of a preferred customization of the structure of FIG. 10 for implementing the cell configuration of FIG. 9D. In FIG. 12D, similarly to FIG. 12B, a connection 501 is defined between a terminal 314 and a terminal 346; a connection 503 is defined between a terminal 345 and a terminal 333; a connection 505 is defined between a terminal 313 and a terminal 333; a connection 511 is defined between a terminal 348 and a terminal 323; a connection 513 is defined between a terminal 347 and a terminal 337 and a connection 515 is defined between terminal 337 and a terminal 345. Connections are defined between a logic input 370 and a terminal 315; between a logic input 378 and a terminal 313; between a terminal 326 and a logic output 382; between a logic input 384 and a terminal 324 and between a logic input 376 and a terminal 325. A connection 517 is defined between a terminal 316 and a terminal 341 and a connection is defined between a terminal 342 and a logic output 380.

In contrast to that shown in FIG. 12B, connection 507 between terminal 343 and terminal 356 is replaced by a connection 521 between terminal 343 and another terminal 341 and by a connection 523 between another terminal 342 and a terminal 344.

Figure 13:
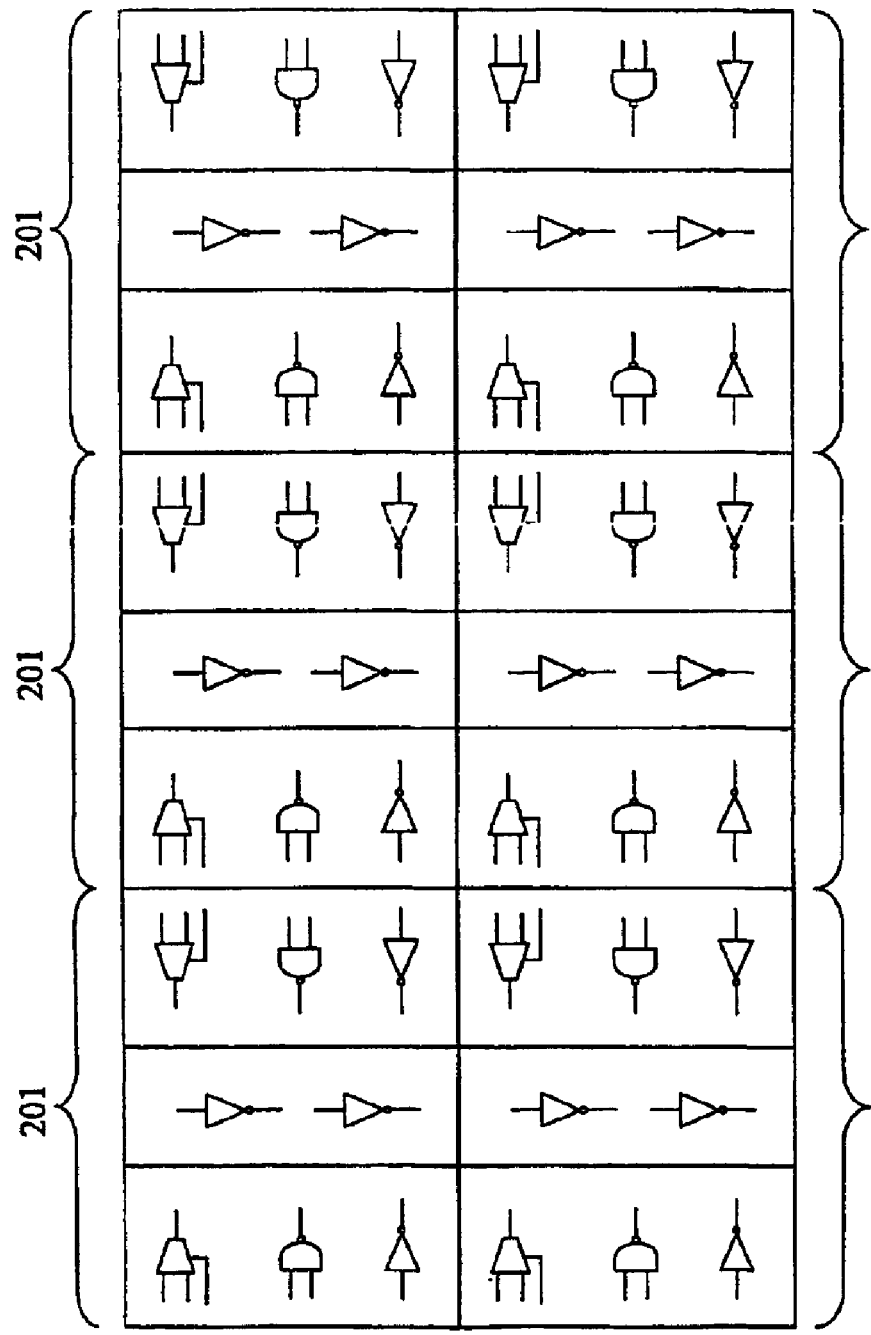
FIG. 13 is a simplified illustration of part of a gate array comprising cells of the type illustrated in FIG. 7.

Reference is now made to FIG. 13 which illustrates in a simplified schematic form, a plurality of logic cells 201 arranged together in an array.

Figure 14:
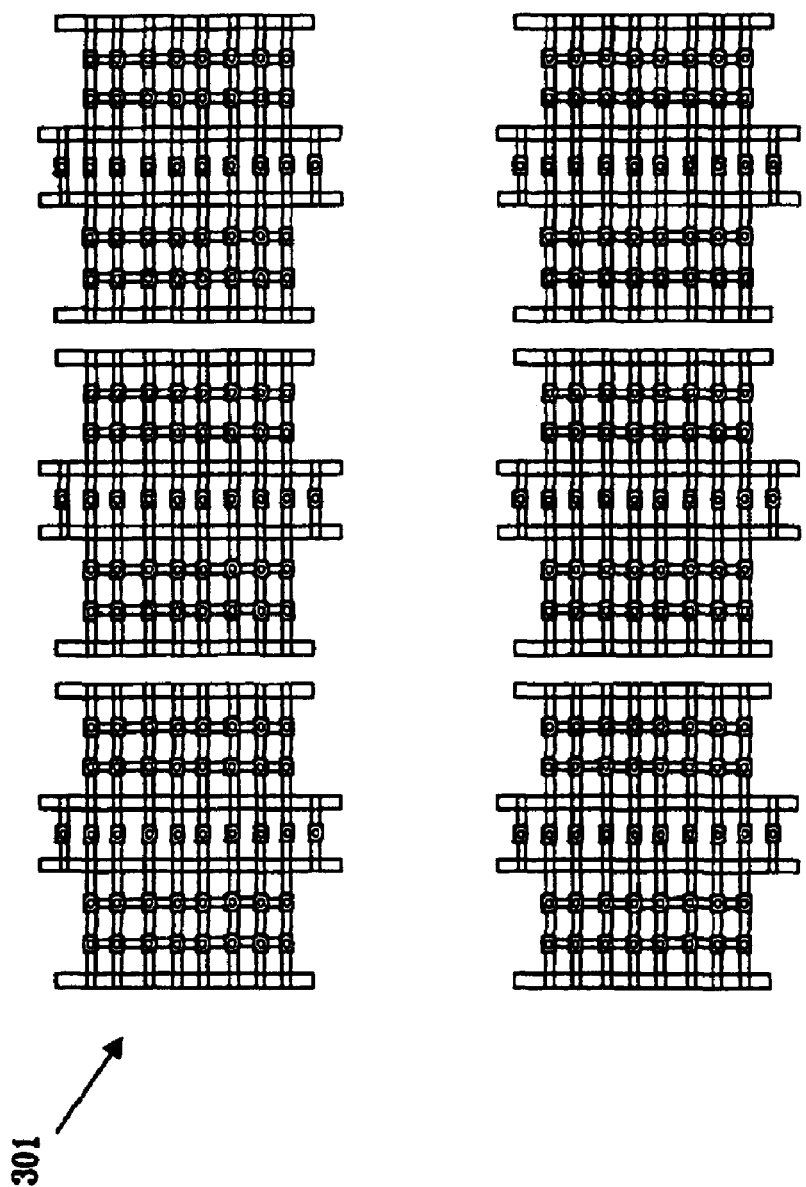
FIG. 14 is a simplified illustration of the configurable metal layer of the portion of the gate array illustrated in FIG. 13.

Reference is now made to FIG. 14, which corresponds to FIG. 13 and shows the layouts 301 of a plurality of logic cells 201 arranged together in an array.

In gate array structures the logic cells and the overlying metal structure are tiled and repeated over a large area, a portion of such area shown schematically in FIG. 6. However, the repetitive structure of the logic cells may cover only a portion of the total device. Other elements such as I/O cells, memory cells, inverters, analogue structures, busses and other special designs for implementing interfaces with other components and implementing intellectual property blocks may co-exist with the tiled logic array structure.

It will be appreciated by persons skilled in the art that the present invention is not limited by what has been particularly shown and described hereinabove. The present invention includes combinations and subcombinations of the embodiments described hereinabove as well as modifications and variations thereof which would occur to a person of skill in the art upon reading the foregoing description and which are not in the prior art.

We claim:

1. A cell forming part of a customizable logic array device, said cell comprising:

a pair of identical logic portions located on opposite sides of a driver portion, wherein said driver portion includes at least two drivers, each having an input and an output.

2. A cell forming part of a customizable logic array device, said cell comprising:

a pair of identical logic portions located on opposite sides of a driver portion, wherein said pair of identical logic portions each comprises:

at least one multiplexer having a select input and an output;

at least one inverter having an input and an output; and at least one NAND gate having two inputs and an output.

3. A cell according to claim 2 and also comprising electrical connections, selectably connecting an output of said at least one multiplexer to any of an input of said at least one inverter, an input of said at least one NAND gate, an input of at least one of said at least two drivers and an input of another one of said at least one multiplexer.

4. A cell according to claim 2 and also comprising electrical connections, selectably connecting an output of said at least one NAND gate to any of an input of said at least one inverter, an input of said at least one multiplexer and an input of at least one of said at least two drivers.

5. A cell according to claim 2 and also comprising electrical connections, selectably connecting an output of said at least one inverter to any of an input of said at least one NAND gate, an input of at least one of said at least two drivers and an input of one of said at least one multiplexer.

6. A cell forming part of a customizable logic array device, said cell comprising:
   a pair of identical logic portions located on opposite sides of a driver portion; and
   electrical connections interconnecting said pair of identical logic portions and said driver portion at the same metal layer,
   wherein said metal layer is a top metal layer of a microelectronic device,
   wherein said electrical connections comprise metal bridges located at the top metal layer, and
   wherein said metal bridges connect terminals which are connected to metal segments at the bottom of said microelectronic device that form inputs and outputs.

* * * * *